US009871205B2

(12) United States Patent
Kim et al.

(10) Patent No.: US 9,871,205 B2
(45) Date of Patent: Jan. 16, 2018

(54) ORGANIC LIGHT-EMITTING DEVICE

(71) Applicant: Samsung Display Co., Ltd., Yongin (KR)

(72) Inventors: Mi-Kyung Kim, Yongin (KR); Kwan-Hee Lee, Yongin (KR); Sam-Il Kho, Yongin (KR); Chang-Woong Chu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 43 days.

(21) Appl. No.: 15/169,242

(22) Filed: May 31, 2016

(65) Prior Publication Data

US 2016/0276595 A1 Sep. 22, 2016

Related U.S. Application Data

(63) Continuation-in-part of application No. 14/752,209, filed on Jun. 26, 2015, now Pat. No. 9,379,334, which (Continued)

(30) Foreign Application Priority Data

Aug. 2, 2013 (KR) ........................ 10-2013-0092248

(51) Int. Cl.
*H01L 51/00* (2006.01)
*H01L 51/50* (2006.01)

(52) U.S. Cl.
CPC ........ *H01L 51/0061* (2013.01); *H01L 51/006* (2013.01); *H01L 51/0052* (2013.01); *H01L 51/0058* (2013.01); *H01L 51/0059* (2013.01); *H01L 51/0067* (2013.01); *H01L 51/0072* (2013.01); *H01L 51/0073* (2013.01); (Continued)

(58) Field of Classification Search
CPC ............... H01L 51/0058; H01L 51/006; H01L 51/0052; H01L 51/0061; H01L 51/0067; H01L 51/0072; H01L 51/5056; H01L 51/5072
See application file for complete search history.

(56) References Cited

U.S. PATENT DOCUMENTS

| | | | |
|---|---|---|---|
| 6,824,893 | B2 | 11/2004 | Hoag et al. |
| 6,967,062 | B2 | 11/2005 | Hatwar et al. |

(Continued)

FOREIGN PATENT DOCUMENTS

| | | | |
|---|---|---|---|
| JP | 2011-37838 | A | 2/2011 |
| KR | 10-2010-0106415 | A | 10/2010 |
| KR | 10-2012-022861 | A | 3/2012 |

*Primary Examiner* — Robert Harlan
(74) *Attorney, Agent, or Firm* — H.C. Park & Associates, PLC

(57) ABSTRACT

Provided is an organic light-emitting device with a blue emission layer. The blue emission layer is an emission layer that emits blue light by a fluorescent emission mechanism. The blue emission layer includes a compound represented by Formula 4 below:

<Formula 4>

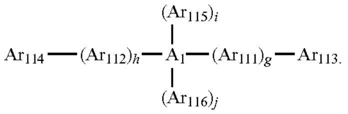

18 Claims, 1 Drawing Sheet

Related U.S. Application Data is a continuation of application No. 14/265,634, filed on Apr. 30, 2014, now Pat. No. 9,093,650.

(52) U.S. Cl.
CPC ...... *H01L 51/5056* (2013.01); *H01L 51/5008* (2013.01); *H01L 51/5012* (2013.01); *H01L 2251/308* (2013.01)

(56) References Cited

U.S. PATENT DOCUMENTS

| | | | | |
|---|---|---|---|---|
| 7,014,978 | B2 | 3/2006 | Bellmann et al. | |
| 7,029,766 | B2 | 4/2006 | Huo et al. | |
| 7,033,681 | B2 | 4/2006 | Conley | |
| 8,026,662 | B2 | 9/2011 | Ishihara et al. | |
| 8,436,390 | B2 | 5/2013 | Ikeda et al. | |
| 8,441,004 | B2 | 5/2013 | Fehrer et al. | |
| 8,911,885 | B2 * | 12/2014 | Kim | C07D 209/60 428/690 |
| 8,993,128 | B2 * | 3/2015 | Lee | C07D 401/14 428/690 |
| 8,999,528 | B2 * | 4/2015 | Kim | H01L 51/0072 257/40 |
| 9,005,770 | B2 | 4/2015 | Taka et al. | |
| 9,051,328 | B2 * | 6/2015 | Kim | C07D 487/06 |
| 9,401,484 | B2 * | 7/2016 | Kim | H01L 51/0085 |
| 2007/0035234 | A1 | 2/2007 | Lee | |
| 2007/0035238 | A1 | 2/2007 | Nakagawa et al. | |
| 2007/0080634 | A1 | 4/2007 | Wolk | |
| 2007/0182316 | A1 | 8/2007 | Mathai et al. | |
| 2010/0301312 | A1 | 12/2010 | Jinde et al. | |
| 2012/0091438 | A1 | 4/2012 | Yabunouchi et al. | |
| 2012/0112173 | A1 | 5/2012 | Matsumoto et al. | |
| 2013/0328037 | A1 | 12/2013 | Oshiyama et al. | |
| 2014/0326987 | A1 | 11/2014 | Park et al. | |
| 2015/0155514 | A1 | 6/2015 | Kaiser et al. | |
| 2015/0171356 | A1 | 6/2015 | Nakamura et al. | |

* cited by examiner

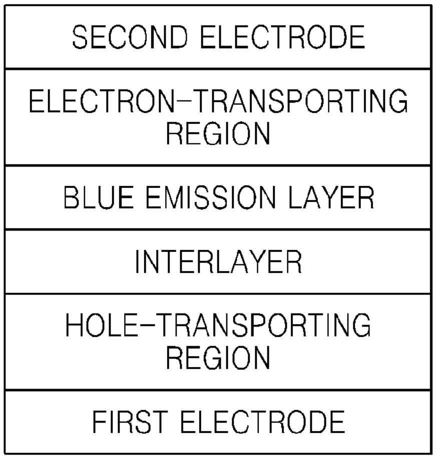
SECOND ELECTRODE
ELECTRON-TRANSPORTING REGION
BLUE EMISSION LAYER
INTERLAYER
HOLE-TRANSPORTING REGION
FIRST ELECTRODE

ORGANIC LIGHT-EMITTING DEVICE

CLAIM OF PRIORITY

This application is a continuation in part of U.S. application Ser. No. 14/752,209, filed on Jun. 26, 2015, which is a continuation of U.S. application Ser. No. 14/265,634, filed on Apr. 30, 2014, now U.S. Pat. No. 9,093,650, issued on Jul. 28, 2015, incorporates by reference the same herein, and claims all benefits accruing under 35 U.S.C. §120. U.S. application Ser. No. 14/265,634 makes reference to, incorporates by reference, and claims all benefits accruing under 35 U.S.C. §119 from an application earlier filed in the Korean Intellectual Property Office on Aug. 2, 2013 and there duly assigned Serial No. 10-2013-0092248. This application also incorporates KR 10-2013-0092248 by reference in its entirety as well.

BACKGROUND OF THE INVENTION

Field of the Invention

One or more embodiments of the present invention relate to organic light-emitting devices.

Description of the Related Art

Organic light-emitting devices (OLEDs) are self-emitting devices that have advantages such as wide viewing angles, excellent contrast, quick response time, and excellent brightness, driving voltage, and response speed characteristics, and can provide multicolored images.

An OLED has a structure including a first electrode, a hole-transporting layer (HTL), an emission layer (EML), an electron-transporting layer (ETL), and a second electrode, which are sequentially stacked on a substrate.

Holes injected from the first electrode move to the EML via the HTL, and electrons injected from the second electrode move to the EML via the ETL. Carriers such as the holes and the electrons recombine in the EML to generate excitons. When excitons drop from an excited state to the ground state, light is emitted.

SUMMARY OF THE INVENTION

One or more embodiments of the present invention include an organic light-emitting device having a novel structure.

Additional aspects will be set forth in part in the description which follows and, in part, will be apparent from the description, or may be learned by practice of the presented embodiments.

According to one or more embodiments of the present invention, an organic light-emitting device (OLED) includes:

a first electrode;

a second electrode disposed opposite to the first electrode;

a blue emission layer (EML) disposed between the first electrode and the second electrode;

a hole-transporting region disposed between the first electrode and the blue EML;

an electron-transporting region disposed between the blue EML and the second electrode; and an interlayer disposed between the blue EML and the hole-transporting region, wherein the interlayer includes a compound represented by Formula 9 below, a thickness of the interlayer is about 5 nm to about 20 nm, and the blue EML includes a compound represented by Formula 4 below.

<Formula 9>

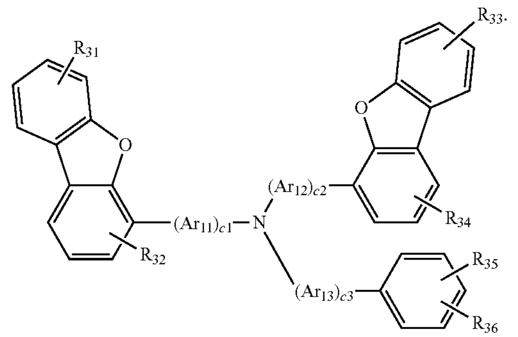

<Formula 4>

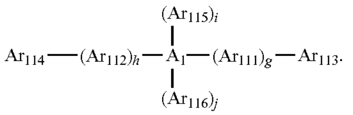

In Formulae 9 and 4, $Ar_{11}$, $Ar_{12}$, $Ar_{13}$, $Ar_{111}$, and $Ar_{112}$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

c1 to c3 are each independently an integer of 1 to 5;

$Ar_{113}$ to $Ar_{116}$ are each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, or —$Si(Q_3)(Q_4)(Q_5)$ (wherein, $Q_1$ to $Q_5$ are each independently selected from a $C_1$-$C_{60}$ alkyl group, a $C_1$-$C_{60}$ alkoxy group, a $C_6$-$C_{60}$ aryl group, or a $C_2$-$C_{60}$ heteroaryl group);

$R_{31}$ to $R_{36}$ are each independently, a hydrogen, a deuterium, a halogen atom, a hydroxyl group, a cyano group, a nitro group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group and a $C_2$-$C_{20}$ heteroaryl group; or a $C_6$-$C_{20}$ aryl group and a $C_2$-$C_{20}$ heteroaryl group, each substituted with at least one of a deuterium, a halogen atom, a hydroxyl group, a cyano group, a nitro group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a dibenzofuranyl group, a dibenzothiophenyl group, a phenyl carbazolyl group, a pyridinyl group, a pyrimidinyl group, a pyrazinyl group, a pyridazinyl group, a triazinyl group, a quinolinyl group, or an isoquinolinyl group, $A_1$ is anthracene or pyrene, and g, h, i, and j are each independently an integer of 0 to 4, provided that, the case of g, h, i, and j being 0 is excluded.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 schematically illustrates a structure of an organic light-emitting device according to an embodiment of this invention.

DETAILED DESCRIPTION OF THE INVENTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

An organic light-emitting device (OLED) of FIG. 1 has a structure in which a first electrode, a hole-transporting region, an interlayer, a blue emission layer (EML), an electron-transporting region, and a second electrode are sequentially layered.

In FIG. 1, the first electrode is an anode that injects holes, and the second electrode is a cathode that injects electrons.

Although not shown in FIG. 1, a substrate may be further provided on the bottom of the first electrode or the top of the second electrode.

The substrate may be any substrate that is used in existing OLEDs such as a glass substrate or a transparent plastic substrate having strong mechanical strength, thermal stability, transparency, surface smoothness, ease of handling, and water resistance.

When the substrate is provided on the bottom of the first electrode, the first electrode may be prepared by providing a material for the first electrode on the substrate through a deposition method or a sputtering method. As the first electrode material, a material having a high work function may be selected to facilitate hole injection.

The first electrode may be a reflective electrode, a semi-transmission electrode, or a transmission electrode. When the substrate is provided on the bottom of the first electrode and the first electrode is a reflective electrode, the OLED of FIG. 1 may be a top emission type OLED, and when the substrate is provided on the bottom of the first electrode and the first electrode is a semi-transmission electrode or a transmission electrode, the OLED of FIG. 1 may be a bottom-emission type or a dual-emission type OLED.

A material for the first electrode may be a material having transparency and conductive capabilities such as indium tin oxide (ITO), indium zinc oxide (IZO), tin oxide ($SnO_2$), and zinc oxide (ZnO). In other embodiments, metals such as magnesium (Mg), aluminum (Al), aluminum-lithium (Al—Li), calcium (Ca), magnesium-indium (Mg—In), magnesium-silver (Mg—Ag) may be used to form the first electrode, but the first electrode material is not limited thereto.

The first electrode may have a single layer or a multi-layer structure. For example, the first electrode may have a three-layered structure of ITO/Ag/ITO, but the first electrode is not limited thereto.

Meanwhile, a second electrode is disposed opposite to the first electrode. A material for the second electrode may be a metal, an alloy, an electro-conductive compound, which have a low work function, or a combination thereof. For example, the second electrode may be formed of lithium (Li), magnesium (Mg), aluminum (Al), aluminum lithium (Al—Li), calcium (Ca), magnesium-indium (Mg—In), magnesium-silver (Mg—Ag), or the like, but the material for the second electrode material is not limited thereto. In some embodiments, to manufacture a top-emission type OLED, a transmission second electrode may be formed of indium tin oxide (ITO) or indium zinc oxide (IZO).

A blue EML is disposed between the first electrode and the second electrode, wherein a hole-transporting region is disposed between the first electrode and the blue EML, an electron-transporting region is disposed between the blue EML and the second electrode, and an interlayer is disposed between the blue EML and the hole-transporting region.

The hole-transporting region may include i) a hole-transporting layer (HTL), and ii) a hole-injecting layer (HIL) disposed between the HTL and the first electrode.

Meanwhile, the electron-transporting region may include i) an electron-transporting layer (ETL), and ii) an electron-injecting layer (EIL) disposed between the ETL and the second electrode.

In the OLED of FIG. 1, holes are injected through the first electrode and move to the blue EML via the hole-transporting region and the interlayer, electrons are injected through the second electrode and move to the blue EML via the electron-transporting region. The holes and the electrons that reach the blue EML recombine in the EML to generate exitons, and light is generated as the exitons move from the excited state to the ground state.

The blue EML is an EML that emits blue light by a fluorescent emission mechanism. The blue EML includes a compound represented by Formula 4 below:

<Formula 4>

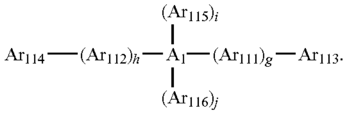

In Formula 4 $Ar_{111}$ to $Ar_{116}$ are as described below, $A_1$ is anthracene or pyrene, and g, h, i, and j are each independently an integer of 0 to 4, provided that the case of g, h, i, and j being 0 is excluded. The compound of Formula 4 may play a role of host in the blue EML. The blue EML may further include a dopant in addition to the compound.

The interlayer of the OLED of FIG. 1 directly contacts the blue EML and the hole-transporting region.

The HIL included in the hole-transporting region may be formed on the first electrode by using various methods such as vacuum deposition, spin coating, casting, or Langmuir-Blodgett (LB) deposition.

When the HIL is formed by using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the deposition conditions are not limited thereto.

When the HIL is formed by using spin coating, the coating conditions may vary according to the compound that is used to form the HIL, and the desired structure and thermal properties of the HIL to be formed. For example, the coating rate may be in a range of about 2000 rpm to about 5000 rpm, and a temperature at which heat treatment is performed to remove a solvent after coating may be in a range of about 80° C. to about 200° C. However, the coating conditions are not limited thereto.

The HIL may be formed of any known material suitable for an HIL, and non-limiting examples of the material to form the HIL are N,N'-diphenyl-N,N'-bis-[4-(phenyl-m-tolyl-amino)-phenyl]-biphenyl-4,4'-diamine (DNTPD); a phthalocyanine compound such as copper phthalocyanine; 4,4',4"-tris (3-methylphenylphenylamino) triphenylamine (m-MTDATA), N,N'-di(1-naphthyl-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and (polyaniline)/poly(4-styrenesulfonate) (PANI/PSS):

m-MTDATA

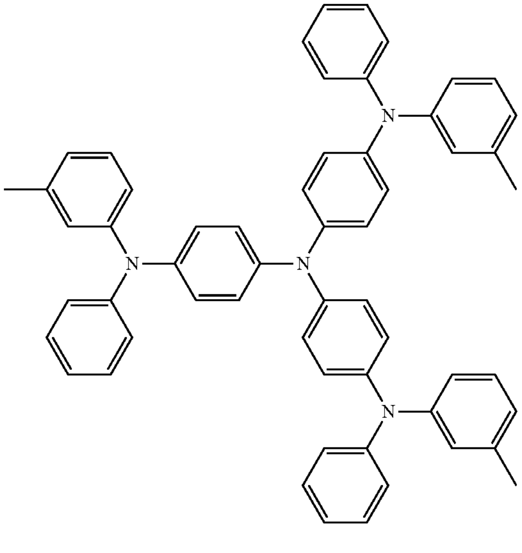

-continued

TDATA

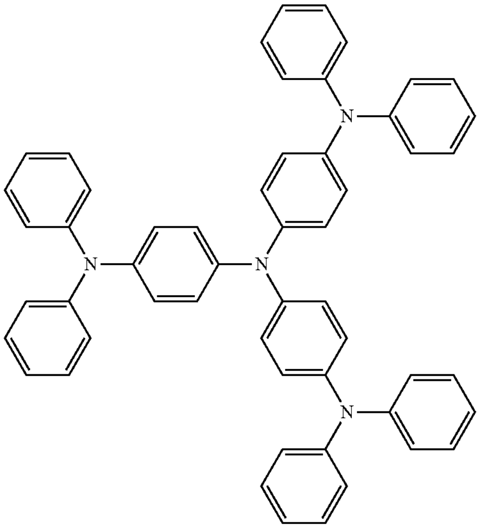

2-TNATA

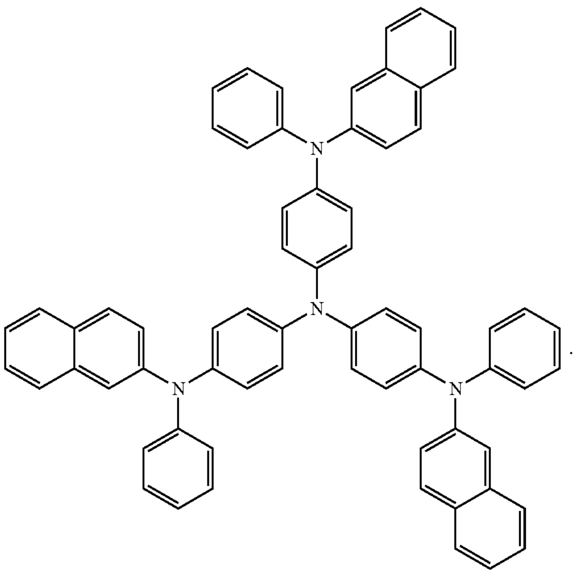

A thickness of the HIL may be about 100 Å to about 10000 Å, and in some embodiments, may be from about 100 Å to about 1000 Å. When the thickness of the HIL is within these ranges, the HIL may have good hole-injecting ability without a substantial increase in driving voltage.

Then, an HTL is formed on the first electrode (on the HIL, when the HIL is formed) which can be by using various methods such as vacuum deposition, spin coating, casting, and LB deposition to form a hole-transporting region, and then an interlayer and a blue EML are sequentially formed thereon. When the HTL, the interlayer, and the blue EML are formed by using vacuum deposition and spin coating, the deposition and coating conditions may be similar to those for the formation of the HIL, though the conditions for deposition and coating may vary according to the compound that is used to form the HTL.

Non-limiting examples of known hole-transporting materials may include, for example, carbazole derivatives such as N-phenylcarbazole; N,N'-bis(3-methyl phenyl)-N,N'-diphenyl-[1,1-biphenyl]-4,4'-diamine (TPD), 4,4',4"-tris(N-carbazolyl) triphenylamine (TCTA), and N,N'-di(1-naphthyl-N, N'-diphenylbenzidine) (NPB).

A thickness of the HTL may be from about 50 Å to about 2000 Å, and in some embodiments, may be from about 100 Å to about 1500 Å. When the thickness of the HTL is within these ranges, the HTL may have good hole-transporting ability without a substantial increase in driving voltage.

Meanwhile, the hole-transporting region may include at least one of a compound represented by Formula 2 below or a compound represented by Formula 3 below.

<Formula 2>

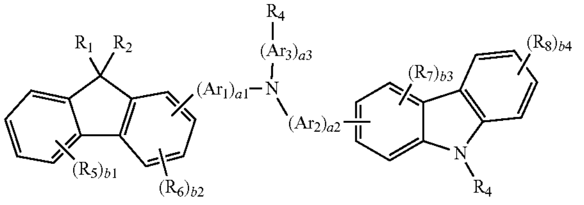

<Formula 3>

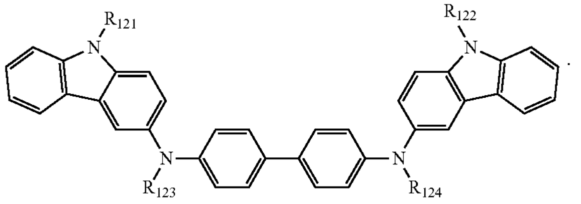

In Formula 2, $Ar_1$ to $Ar_3$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

a1 to a3 are each independently an integer of 0 to 5;

$R_1$ to $R_8$ are each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group;

b1 and b4 are each independently an integer of 1 to 4; and b2 and b3 are each independently an integer of 1 to 3.

For example, when the hole-transporting region includes an HIL and HTL sequentially layered on the first electrode, the HIL may include a compound represented by Formula 3 and the HTL may include a compound represented by Formula 2, but the hole-transporting region is not limited thereto.

In Formula 3, $R_{121}$ to $R_{124}$ may be each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group.

Further descriptions of Formulae 2 and 3 are as provided below.

A thickness of the hole-transporting region is about 100 Å to about 20000 Å, for example, about 100 Å to about 5000 Å. When the thickness of the hole-transporting region is in the range described above, a good hole injecting ability without substantial increase in driving voltage may be obtained.

The interlayer includes the first compound represented by Formula 9 below:

<Formula 9>

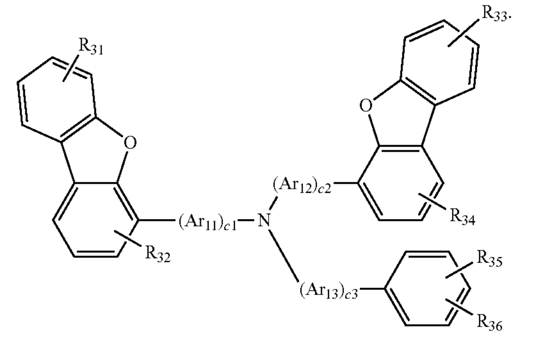

In Formulae 9 and 4, $Ar_{11}$, $Ar_{12}$, $Ar_{13}$, $Ar_{111}$, and $Ar_{112}$ are selected from a substituted or unsubstituted cycloalkylene group, a substituted or unsubstituted $C_2$-$C_{10}$ heterocycloalkylene group, a $C_3$-$C_{10}$ substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

c1 to c3 are each independently an integer of 1 to 5;

$Ar_{113}$ to $Ar_{116}$ are each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, and —$Si(Q_3)(Q_4)(Q_5)$ (wherein, $Q_3$ to $Q_5$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group); and $R_{31}$ to $R_{36}$ are each independently, a hydrogen, a deuterium, a halogen atom, a hydroxyl group, a cyano group, a nitro group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group and a $C_2$-$C_{20}$ heteroaryl group; or a $C_6$-$C_{20}$ aryl group and a $C_2$-$C_{20}$ heteroaryl group, each substituted with at least one of a deuterium, a halogen atom, a hydroxyl group, a cyano group, a nitro group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a dibenzofuranyl group, a dibenzothiophenyl group, a phenyl carbazolyl group, a pyridinyl group, a pyrimidinyl group, a pyrazinyl group, a pyridazinyl group, a triazinyl group, a quinolinyl group, or an isoquinolinyl group.

Further description of Formula 9 is provided below.

According to one embodiment, the interlayer may include the first compound represented by Formula 9-1 below:

<Formula 9-1>

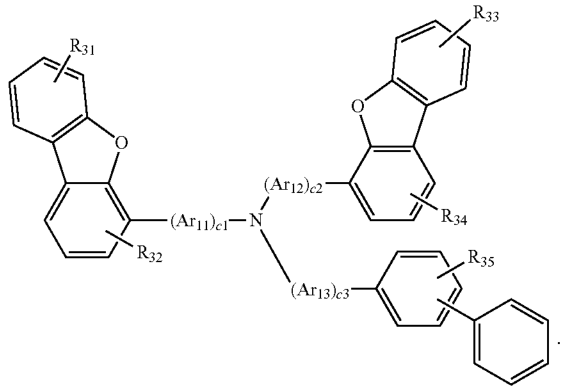

In Formulae 9-1, descriptions for $Ar_{11}$ to $Ar_{13}$, c1 to c3 and $R_{31}$ to $R_{35}$ are same as the descriptions for Formula 9.

According to other embodiment, the interlayer may include the first compound represented by Formula 9-1A below:

<Formula 9-1A>

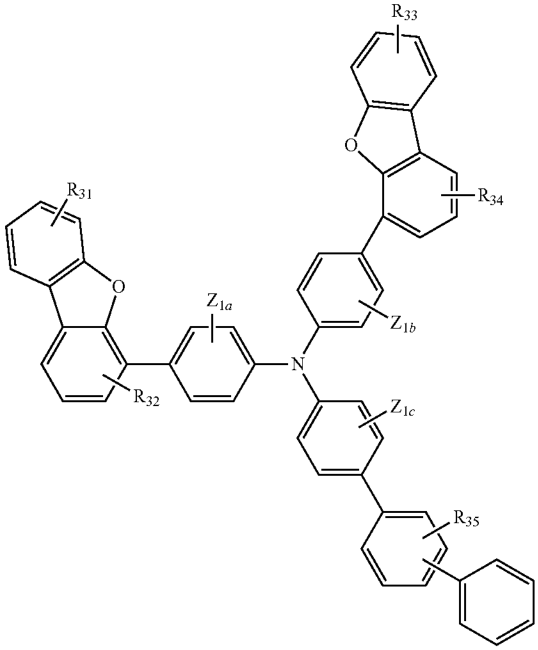

In Formulae 9-1A, descriptions for $R_{31}$ to $R_{35}$ are same as in Formula 9 and definitions for $Z_{1a}$ to $Z_{1c}$ are same as definitions for $Z_1$ in this disclosure.

For example, $Z_{1a}$ to $Z_c$ in Formula 9-1A may be each independently selected from a hydrogen, a deuterium, a halogen atom, a hydroxyl group, a cyano group, a nitro group, $C_1$-$C_{20}$ alkyl group, a $C_1$-$C_{20}$ alkoxy group, a phenyl group, a naphthyl group, an anthracenyl group, a fluorenyl group, a dibenzofuranyl group, and a dibenzothiophenyl group.

A thickness of the interlayer is in a range of about 5 nm to about 20 nm.

For example, a thickness of the interlayer may be about 8 nm to about 11 nm, but the thickness is not limited thereto.

A highest occupied molecular orbital (HOMO) value of the interlayer including the first compound represented by Formula 9 has a value between a HOMO value of the hole-transporting region and a HOMO value of the host in the EML. Accordingly, a hole-transporting rate may be effectively controlled by the interlayer, so that an OLED including the interlayer may have high emission efficiency. Also, by including the interlayer having the thickness in the above-described range, an OLED without an increase in driving voltage may be obtained.

For example in Formulas 9, 9-1, 2, and 4, $Ar_1$ to $Ar_3$, $Ar_{11}$, $Ar_{12}$, $Ar_{13}$, $Ar_{111}$, and $Ar_{112}$ are each independently, a phenylene group, a pentalenylene group, an indenylene group, a naphthylene group, an azulenylene group, a heptalenylene group, an indacenylene group, an acenaphthylene group, a fluorenylene group, spiro-fluorenylene group, a phenalenylene group, a phenanthrenylene group, an anthracenylene group, an fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, benzothiazolylene group, an isoxazolylene group, an oxazolylene group, a triazolylene group, a tetrazolylene group, an oxadiazolylene group, a triazinylene group, a benzooxazolylene group, a dibenzofuranylene group, dibenzothiophenylene group, or a benzocarbazolyl group; or a phenylene group, a pentalenylene group, an indenylene group, a naphthylene group, an azulenylene group, a heptalenylene group, an indacenylene group, an acenaphthylene group, a fluorenylene group, spiro-fluorenylene group, phenalenylene group, a phenanthrenylene group, an anthracenylene group, an fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, a benzofuranylene group, a thiophenylene group, a benzothiophenylene group, a thiazolylene group, an isothiazolylene group, benzothiazolylene group, an isoxazolylene group, an oxazolylene group, a triazolylene group, a tetrazolylene group, an oxadiazolylene group, a triazinylene group, a benzooxazolylene group, a dibenzofuranylene group, a dibenzothiophenylene group, and a benzocarbazolyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group or a $C_2$-$C_{20}$ heteroaryl group;

a $C_6$-$C_{20}$ aryl group, or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group;

—$N(Q_{11})(Q_{12})$, and —$Si(Q_{13})(Q_{14})(Q_{15})$ (wherein, $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group).

For example, in Formula 9, 9-1, 2, and 4, $Ar_1$ to $Ar_3$, $Ar_{11}$, $Ar_{12}$, $Ar_{13}$, $Ar_{21}$, $Ar_{111}$, and $Ar_{112}$ may be each independently represented by Formulae 10-1 to 10-24 below, but they are not limited thereto:

Formula 10-1

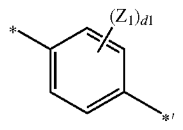

Formula 10-2

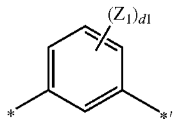

Formula 10-3

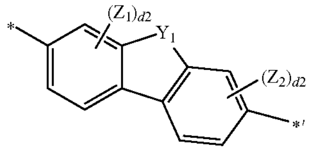

Formula 10-4

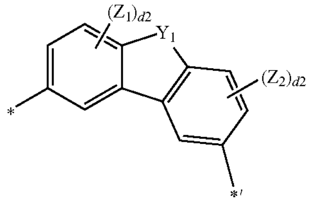

Formula 10-5

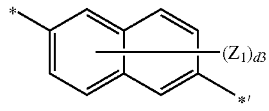

Formula 10-6

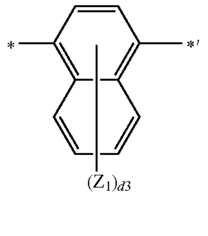

Formula 10-7

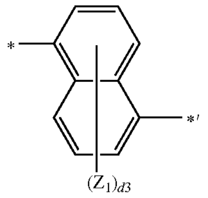

-continued

Formula 10-8

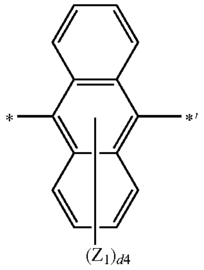

Formula 10-9

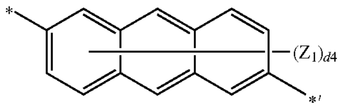

Formula 10-10

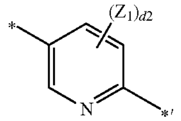

Formula 10-11

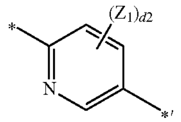

Formula 10-12

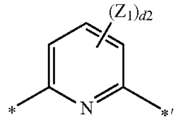

Formula 10-13

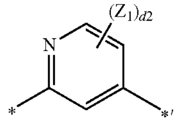

Formula 10-14

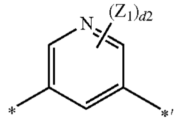

Formula 10-15

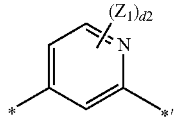

Formula 10-16

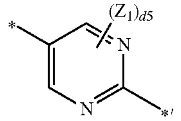

Formula 10-17

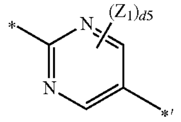

-continued

Formula 10-18

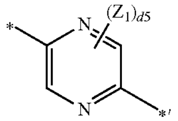

Formula 10-19

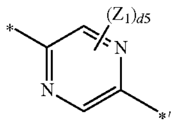

Formula 10-20

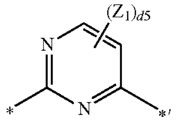

Formula 10-21

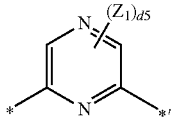

Formula 10-22

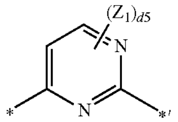

Formula 10-23

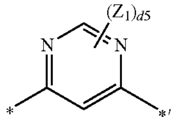

Formula 10-24

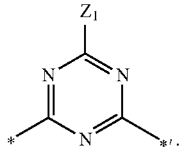

In Formulae 10-1 to 10-24, $Y_1$ is O, S, $C(R_{21})(R_{22})$, or $N(R_{23})$;

$Z_1$, $Z_2$, and $R_{21}$ to $R_{23}$ are each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group and a $C_2$-$C_{20}$ heteroaryl group;

a $C_6$-$C_{20}$ aryl group and a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group; or —$N(Q_{11})(Q_{12})$ and —$Si(Q_{13})(Q_{14})(Q_{15})$ (wherein, $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);

d1 is an integer of 1 to 4;

d2 is an integer of 1 to 3;

d3 is an integer of 1 to 6;

d4 is an integer of 1 to 8;

d5 is an integer of 1 or 2; and

* and *' represent connections to Formulas 9, 9-1, 2 or 4.

For example, $Z_1$, $Z_2$, and $R_{21}$ to $R_{23}$ are each independently, a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group;

—$N(Q_{11})(Q_{12})$, and —$Si(Q_{13})(Q_{14})(Q_{15})$ (wherein, $Q_{11}$ to $Q_{15}$ are each independently a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group); but, they are not limited thereto.

In Formulae 10-1 to 10-24, d1 is an integer of 1 to 4; d2 is an integer of 1 to 3; d3 is an integer of 1 to 6; d4 is an integer of 1 to 8; and d5 may be 1 or 2. For example, d1, d2, d3, and d4 may be 1 or 2.

According to an embodiment, in Formulae 2 and 4, $Ar_1$ to $Ar_3$, $Ar_{11}$, $Ar_{12}$, $Ar_{13}$, $Ar_{21}$, $Ar_{111}$, and $Ar_{112}$ may be each independently represented by one of Formulae 11-1 to 11-11 below, but they are not limited thereto:

Formula 11-1

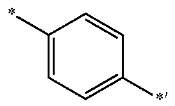

Formula 11-2

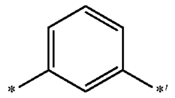

Formula 11-3

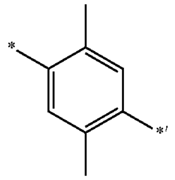

Formula 11-4

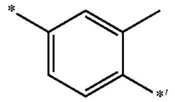

Formula 11-5

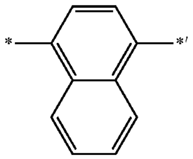

Formula 11-6

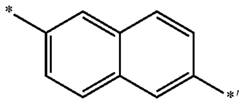

Formula 11-7

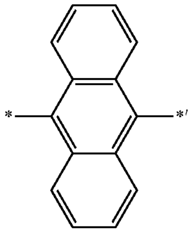

Formula 11-8

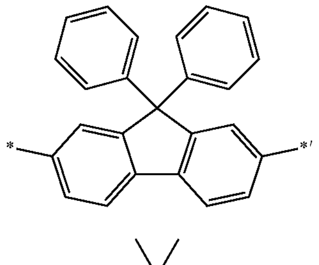

Formula 11-9

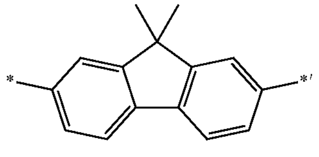

Formula 11-10

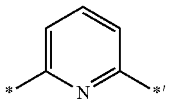

-continued

Formula 11-11

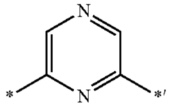

Where * and *' represent connections to Formula 2 or 4.

In Formula 2, a1 is the number of $Ar'_1$s, a2 is the number of $Ar'_2$s, a3 is the number of $Ar_3$s. a1 to a3 may be each independently an integer of 0 to 5, for example, an integer of 0 to 3. When a1 and/or a2 is 0, "carbazole" and/or "fluorene" of Formula 1 may be directly connected to "N". When a1 is 2 or greater, the two or more of $Ar'_1$s may be the same or different. When a2 is 2 or greater, the two or more $Ar'_2$s may be the same or different. When a3 is 2 or greater, the two or more $Ar'_3$s may be the same or different.

In Formula 4, g represents the number of $Ar'_{111}$s, h represents the number of $Ar'_{112}$, i represents the number of $Ar_{115}$s, and j represents the number of $Ar'_{116}$s. When g is 2 or greater, a plurality of $Ar'_{111}$s may be the same or different. When h is 2 or greater, a plurality of $Ar'_{112}$s may be the same or different. When i is 2 or greater, a plurality of $Ar'_{115}$s may be the same or different. When j is 2 or greater, a plurality of $Ar'_{116}$s may be the same or different.

According to an embodiment, in Formula 2 i) a1=0 and a2=0; ii) a1=1 and a2=0; iii) a1=2 and a2=0; iv) a1=0 and a2=1; v) a1=0 and a2=2; or vi) a1=1 and a2=1.

In Formulas 9 and 9-1, c1 represents the number of $Ar'_{11}$s, c2 represents the number of $Ar'_{12}$s and c3 represents the number of $Ar'_{13}$s. c1 to c3 are each independently an integer of 1 to 5, for example, 1, 2, or 3. When c1 is 2 or greater, the two or more $Ar'_{11}$s may be the same or different. When c2 is 2 or greater, the two or more $Ar'_{12}$s may be the same or different. When c3 is 2 or greater, the two or more $Ar'_{13}$s may be the same or different.

In Formulae 2, and 4, $R_1$, $R_2$, and $R_4$ to $R_8$, are each independently a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$N(Q_1)(Q_2)$, or —$Si(Q_3)(Q_4)(Q_5)$ (wherein, $Q_1$ to $Q_5$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group); and $R_3$, and $Ar_{113}$ to $Ar_{116}$ are each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, or —$Si(Q_3)(Q_4)(Q_5)$ (wherein, $Q_1$ to $Q_5$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group).

In Formulae 2, and 4, $R_1$ to $R_8$, and $Ar_{113}$ to $Ar_{116}$ are each independently selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, or a benzocarbazolyl group; or a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, or a benzocarbazolyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group or a $C_2$-$C_{20}$ heteroaryl group;

a $C_6$-$C_{20}$ aryl group or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group;

—$N(Q_{11})(Q_{12})$, or —$Si(Q_{13})(Q_{14})(Q_{15})$ (wherein, $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group).

For example, in Formulae 2 and 4, $R_3$ to $R_8$, and $Ar_{113}$ to $Ar_{116}$ may be each independently represented by Formulae 12-1 to 12-22 below:

Formula 12-1

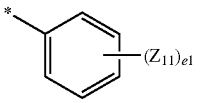

Formula 12-2

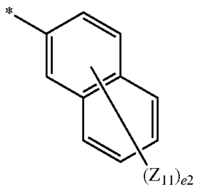

Formula 12-3

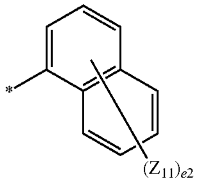

Formula 12-4

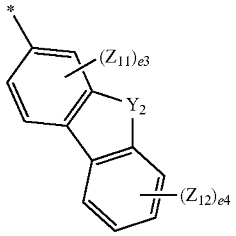

Formula 12-5

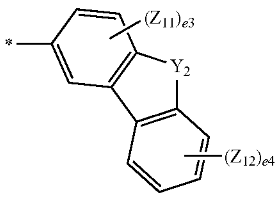

-continued

Formula 12-6

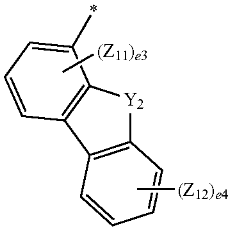

Formula 12-7

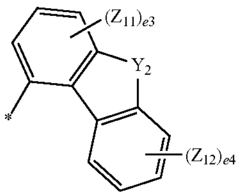

Formula 12-8

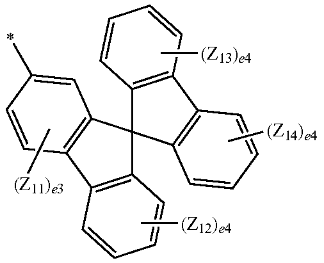

Formula 12-9

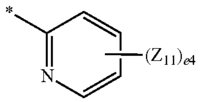

Formula 12-10

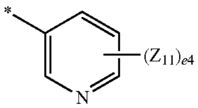

Formula 12-11

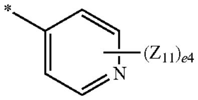

Formula 12-12

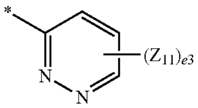

Formula 12-13

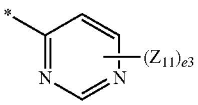

Formula 12-14

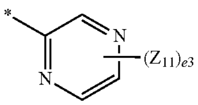

Formula 12-15

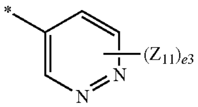

-continued

Formula 12-16

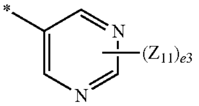

Formula 12-17

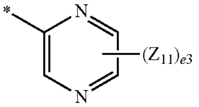

Formula 12-18

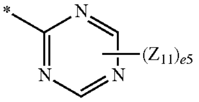

Formula 12-19

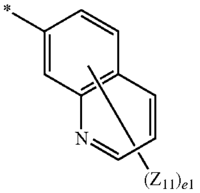

Formula 12-20

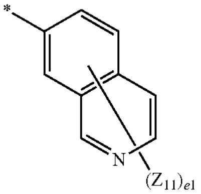

Formula 12-21

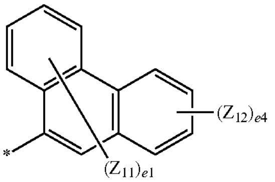

Formula 12-22

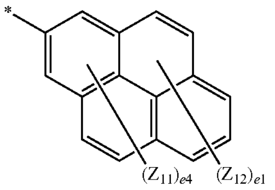

In Formulae 12-1 to 12-22, $Y_2$ is O, S, $C(R_{25})(R_{26})$, or $N(R_{27})$;

$Z_{11}$ to $Z_{14}$, and $R_{25}$ to $R_{27}$ are each independently selected from, a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group or a $C_2$-$C_{20}$ heteroaryl group;

a $C_6$-$C_{20}$ aryl group or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group; and —$N(Q_{11})(Q_{12})$ or —$Si(Q_{13})(Q_{14})(Q_{15})$ (wherein, $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group);

e1 may be an integer of 1 to 5;

e2 may be an integer of 1 to 7;

e3 may be an integer of 1 to 3;

e4 may be an integer of 1 to 4; and e5 may be an integer of 1 or 2 and wherein * represents a connection to Formulas 2 or 4.

According to another embodiment, in Formulae 2 and 4, $R_3$ to $R_8$, and $Ar_{113}$ to $Ar_{116}$ may be each independently represented by Formulae 13-1 to 13-19 below, but they are not limited thereto:

Formula 13-1

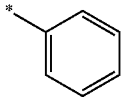

Formula 13-2

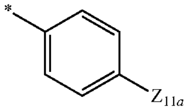

Formula 13-3

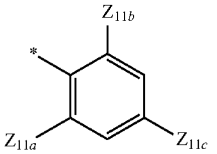

Formula 13-4

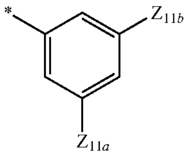

Formula 13-5

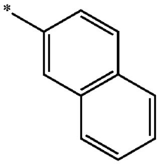

Formula 13-6

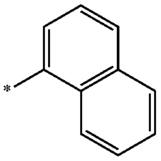

-continued

Formula 13-7

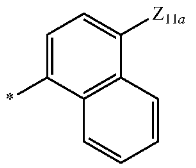

Formula 13-8

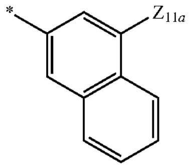

Formula 13-9

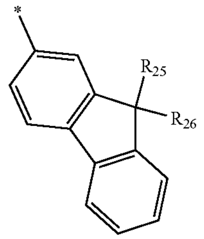

Formula 13-10

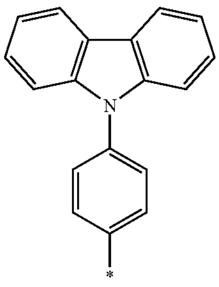

Formula 13-11

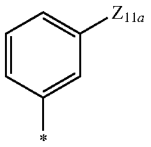

Formula 13-12

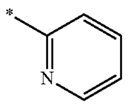

Formula 13-13

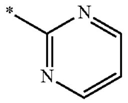

Formula 13-14

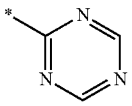

Formula 13-15

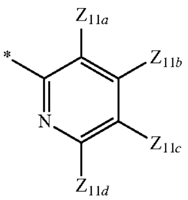

-continued

Formula 13-16

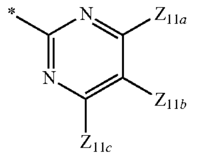

Formula 13-17

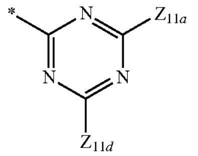

Formula 13-18

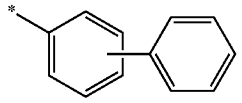

Formula 13-19

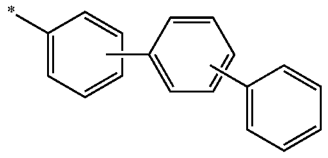

In Formulae 13-1 to 13-19, descriptions of $Z_{11a}$ to $Z_{11c}$ are as described in the description of $Z_{11}$ above and * represents a connection with Formulas 9, 2 or 4.

For example, in Formulae 13-1 to 13-19, $Z_{11a}$ to $Z_{11c}$, $R_{25}$, and $R_{26}$ may be each independently selected from, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group; and a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group.

According to another embodiment, in Formulae 9, 9-1 and 9-1A above, $R_{31}$ to $R_{36}$ may be each independently selected from, a hydrogen, a deuterium, a halogen atom, a hydroxyl group, a cyano group, a nitro group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amidino group, a hydrazine, a hydrazone, a carboxylic acid group or a salt thereof, a sulfonic acid group or a salt thereof, or a phosphoric acid or a salt thereof;

a phenyl group, a naphthyl group, an anthracenyl group, a fluorenyl group, a dibenzofuranyl group, a dibenzothiophenyl group, a pyridinyl group, a pyrimidinyl group, a pyrazinyl group, a pyridazinyl group, a triazinyl group, a quinolinyl group, or an isoquinolinyl group; and a phenyl group, a naphthyl group, an anthracenyl group, a fluorenyl group, a dibenzofuranyl group, a dibenzothiophenyl group, a pyridinyl group, a pyrimidinyl group, a pyrazinyl group, a pyridazinyl group, a triazinyl group, a quinolinyl group, and an isoquinolinyl group, each substituted with at least one of a deuterium, a halogen atom, a hydroxyl group, a cyano group, a nitro group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenyl fluorenyl group, a dibenzofuranyl group, a dibenzothiophenyl group, a phenyl carbazolyl group, a pyridinyl group, a pyrimidinyl group, a pyrazinyl group, a pyridazinyl group, a triazinyl group, a quinolinyl group, or an isoquinolinyl group.

In Formula 2 above, b1 is the number of $R'_5$s, b2 is the number of $R'_6$s, b3 is the number of $R'_7$s, and b4 is the number of $R'_8$s. b1, and b4 are each independently an integer of 1 to 4, and b2, and b3 are each independently an integer of 1 to 3.

According to another embodiment, in Formulae 9, 9-1 and 9-1A, $R_{31}$ to $R_{36}$ may be each independently selected from:

a hydrogen, a deuterium, a halogen atom, a hydroxyl group, a cyano group, a nitro group, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, and a nitro group;

a phenyl group, a naphthyl group, an anthracenyl group, a fluorenyl group, a dibenzofuranyl group, a dibenzothiophenyl group, and a pyridinyl group; and a phenyl group, a naphthyl group, an anthracenyl group, a fluorenyl group, a dibenzofuranyl group, a dibenzothiophenyl group, and a pyridinyl group, each substituted with at least one of a deuterium, a halogen atom, a hydroxyl group, a cyano group, a nitro group, $C_1$-$C_{20}$ alkyl group, a $C_1$-$C_{20}$ alkoxy group, a phenyl group, a naphthyl group, an anthracenyl group, a fluorenyl group, a dibenzofuranyl group, a dibenzothiophenyl group.

According to another embodiment, in Formulae 9, 9-1 and 9-1A, $R_{31}$ to $R_{36}$ may be each independently selected from a hydrogen, a deuterium, a halogen atom, a hydroxyl group, a cyano group, a nitro group, $C_1$-$C_{20}$ alkyl group, a $C_1$-$C_{20}$ alkoxy group, a phenyl group, a naphthyl group, an anthracenyl group, a fluorenyl group, a dibenzofuranyl group, and a dibenzothiophenyl group.

In one embodiment, in Formulae 9 and 9-1, $Ar_{11}$ to $Ar_{13}$ may be each independently represented by one of Formulae 10-1 and 10-2, in which $Z_1$ is not —N($Q_{11}$)($Q_{12}$) (for example, one of Formulae 11-1 to 11-4);

c1 and c2 may be 1;

c3 may be 1 or 2;

$R_{31}$ to $R_{36}$ are each independently selected from:

a hydrogen, a deuterium, a halogen atom, a hydroxyl group, a cyano group, a nitro group, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, and a nitro group;

a phenyl group, a naphthyl group, an anthracenyl group, a fluorenyl group, a dibenzofuranyl group, a dibenzothiophenyl group, and a pyridinyl group; and a phenyl group, a naphthyl group, an anthracenyl group, a fluorenyl group, a dibenzofuranyl group, a dibenzothiophenyl group, and a pyridinyl group, each substituted with at least one of a deuterium, a halogen atom, a hydroxyl group, a cyano group, a nitro group, $C_1$-$C_{20}$ alkyl group, a $C_1$-$C_{20}$ alkoxy group, a phenyl group, a naphthyl group, an anthracenyl group, a fluorenyl group, a dibenzofuranyl group, a dibenzothiophenyl group.

The compound of Formula 2 may be represented by Formulas 2A(1) or 2B(1) below, but the compound of Formula 2 is not limited thereto:

<Formula 2A(1)>

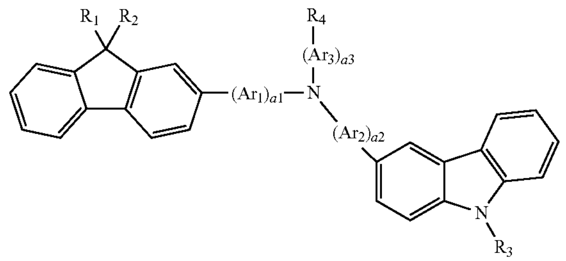

<Formula 2B(1)>

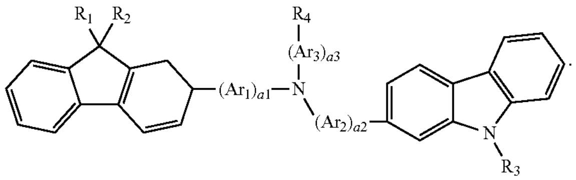

In Formulae 2A(1) and 2B(1) above, $R_1$ to $R_4$, $Ar_1$ to $Ar_3$, a1, a2, and a3 are the same as described above.

According to an embodiment, the compound of Formula 9 may include at least one of Compounds 721 to 730, but the first compound is not limited thereto:

-continued
721
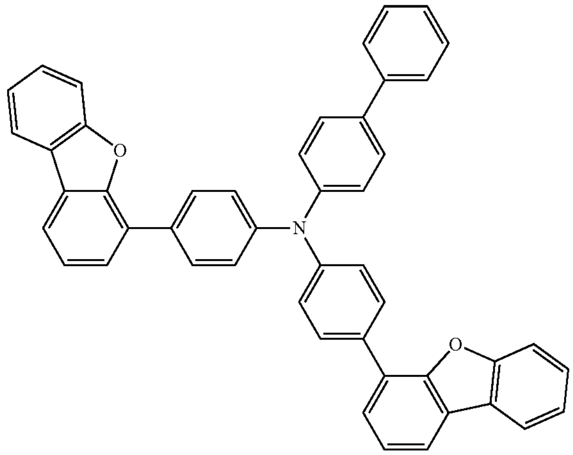
722
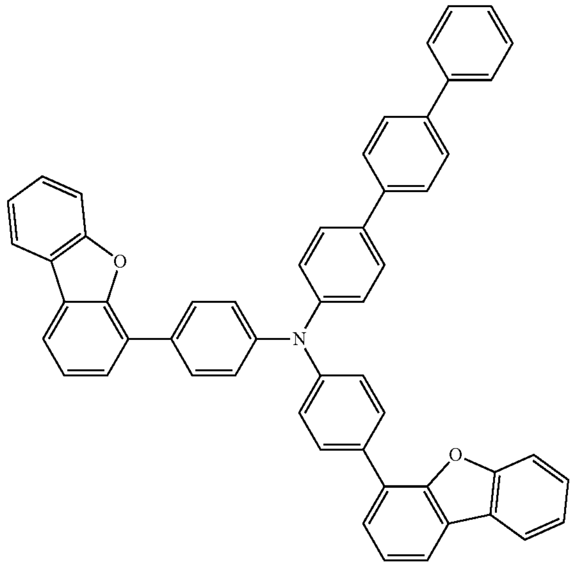
723
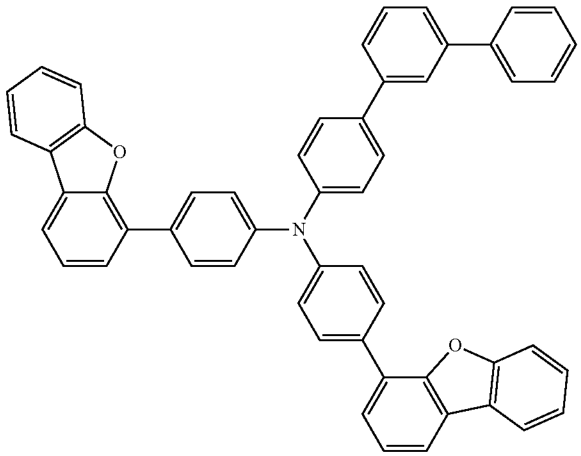
724
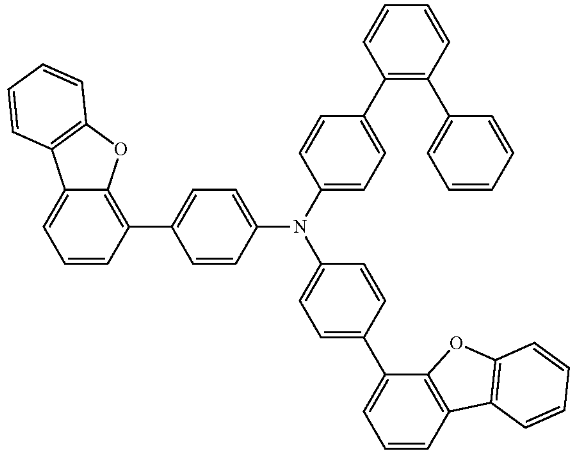
725
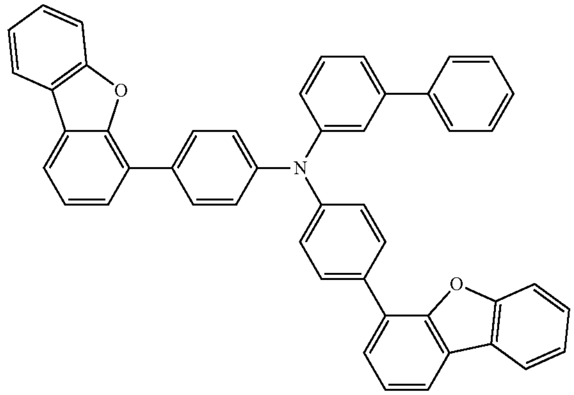
726
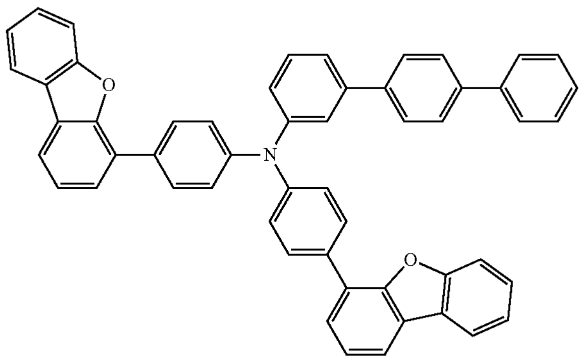

-continued
727
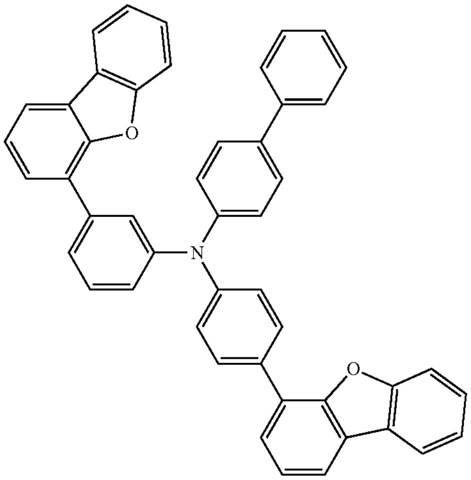
728
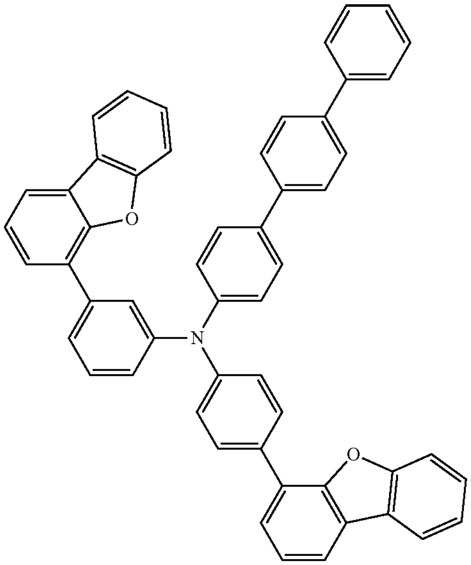
729
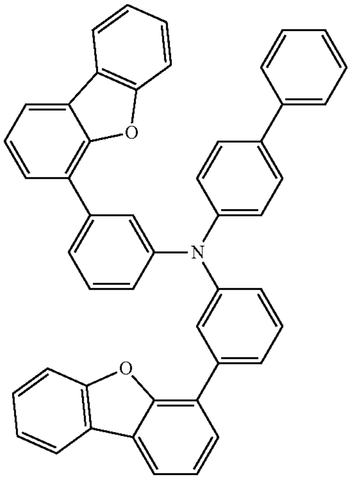
-continued
730
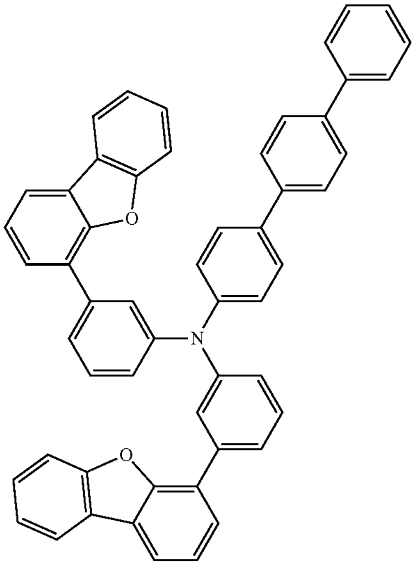
Meanwhile, the compound of Formula 2 may include at least one of Compounds 309 to 320, but the second compound is not limited thereto:
309
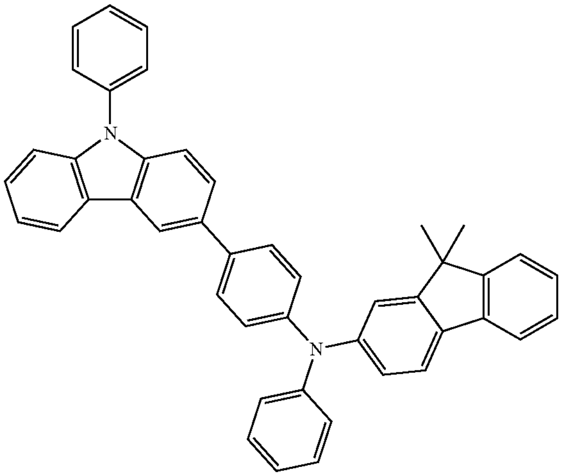

-continued
310
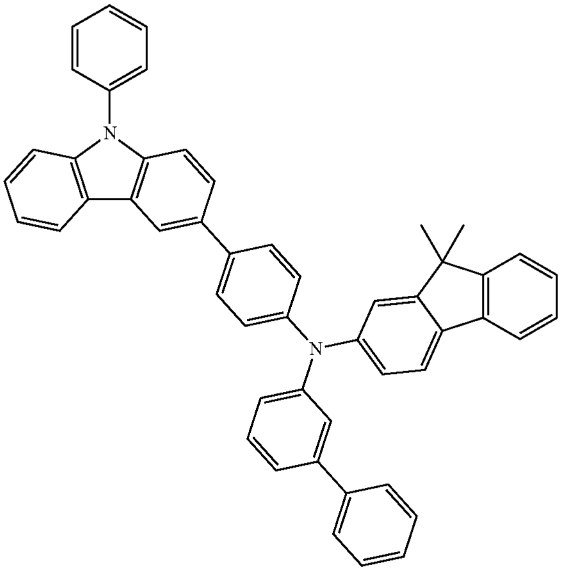
311
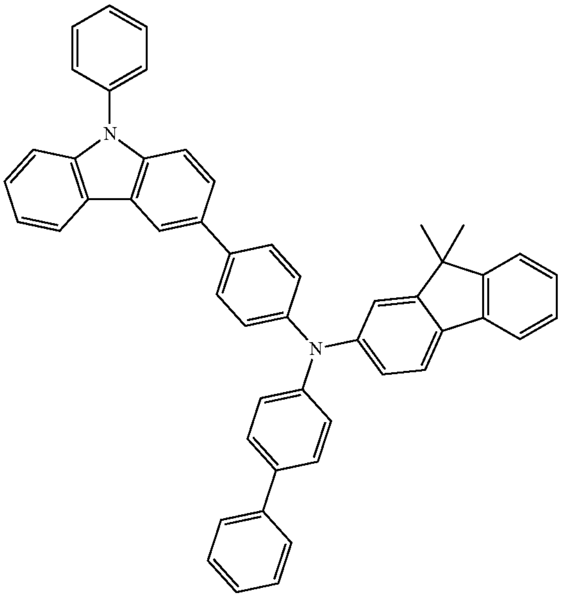
-continued
312
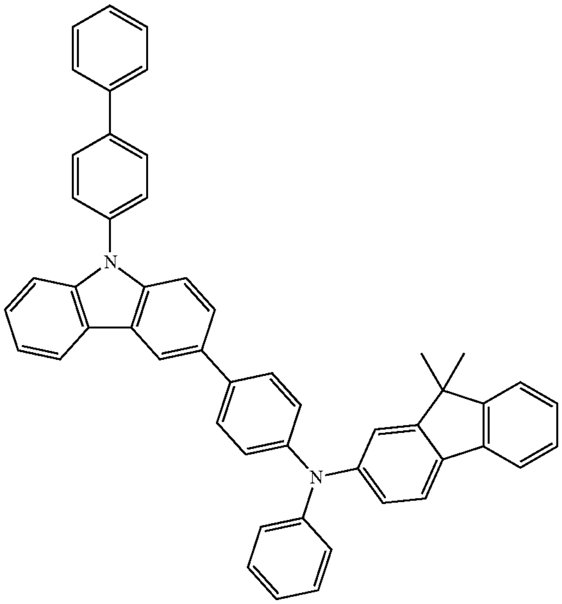
313
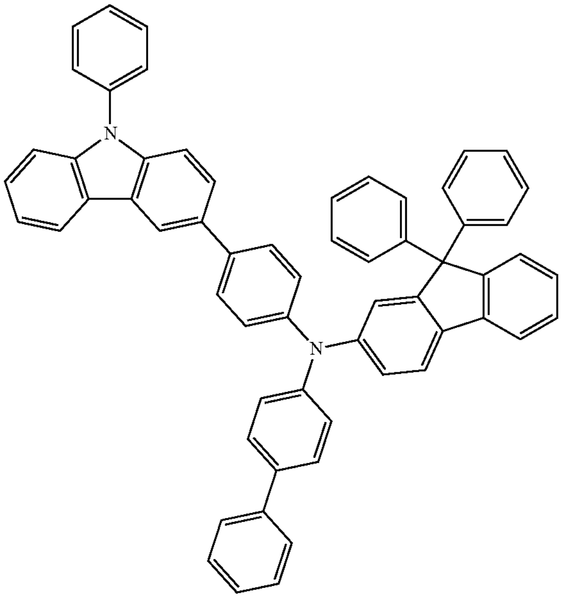

-continued
314
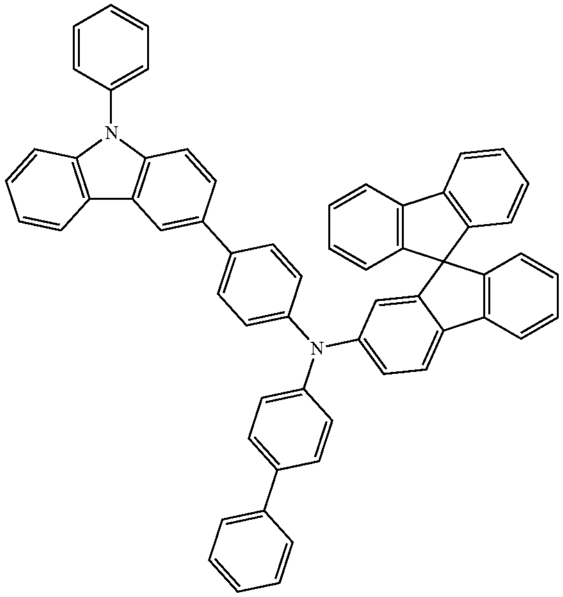
315
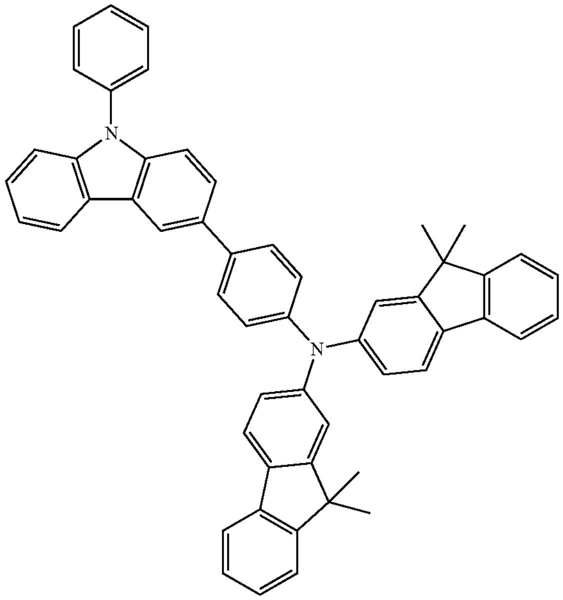
-continued
316
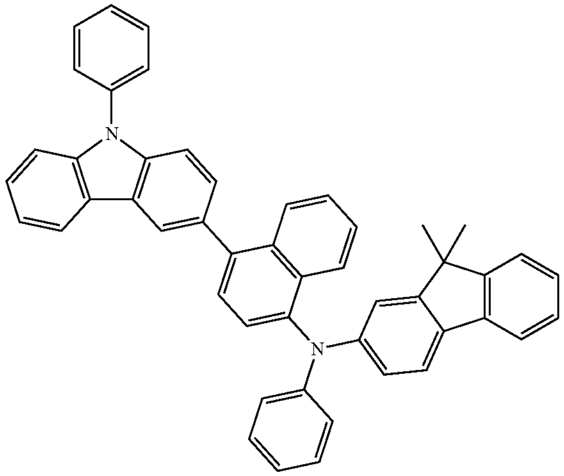
317
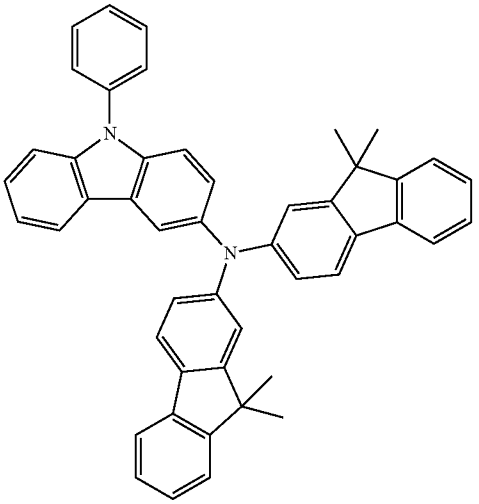
318
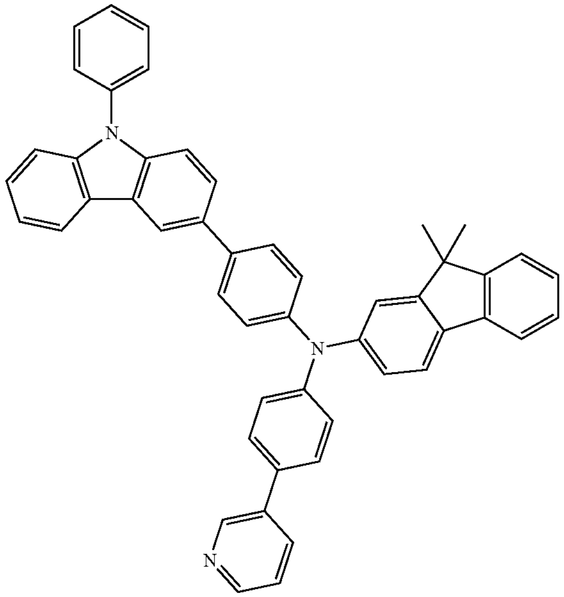

-continued

319

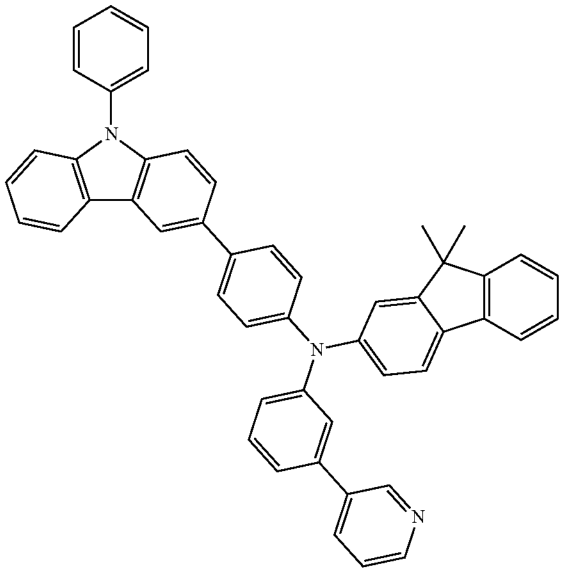

320

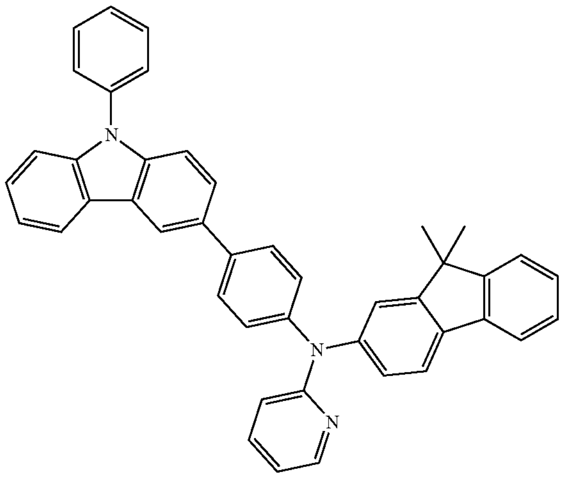

In Formula 3, $R_{121}$ to $R_{124}$ may be each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group.

For example, $R_{121}$ to $R_{124}$ are each independently, a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{10}$ alkyl group (for example, a methyl group, an ethyl group, a propyl group, a butyl group, a pentyl group, and a hexyl group), or a $C_1$-$C_{10}$ alkoxy group (for example, a methoxy group, an ethoxy group, a propoxy group, a butoxy group, and a pentoxy group);

a $C_1$-$C_{10}$ alkyl group and a $C_1$-$C_{10}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a phenyl group, a naphthyl group, an anthracenyl group, a fluorenyl group, and a pyrenyl group; or a phenyl group, a naphthyl group, an anthracenyl group, a fluorenyl group, and a pyrenyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{10}$ alkyl group, and a $C_1$-$C_{10}$ alkoxy group; but, they are not limited thereto.

The compound of Formula 3 may include at least one of Compounds 301 to 308, but they are not limited thereto.

301

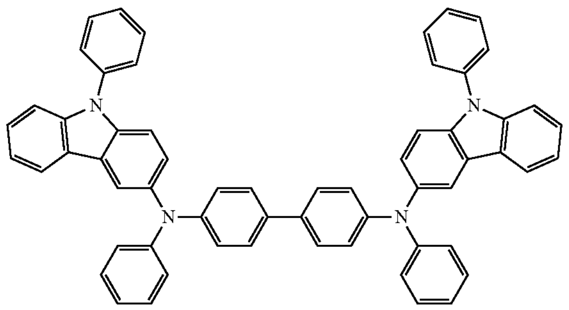

302

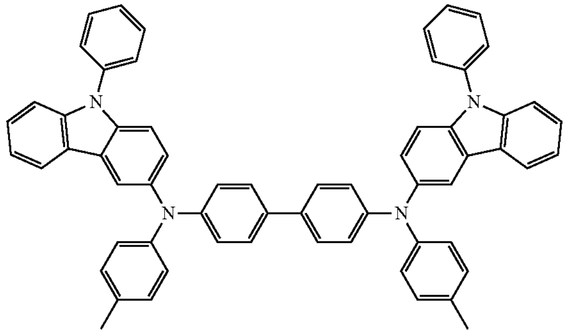

303

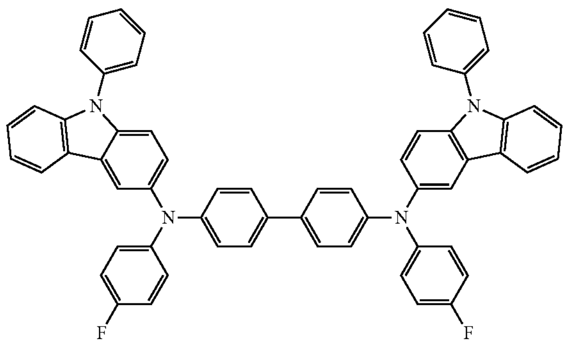

-continued

304

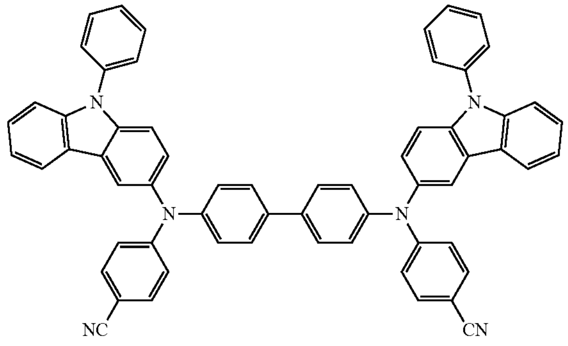

305

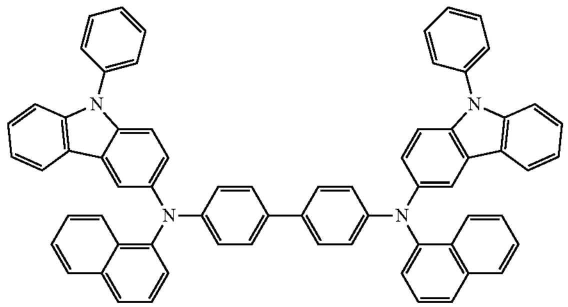

306

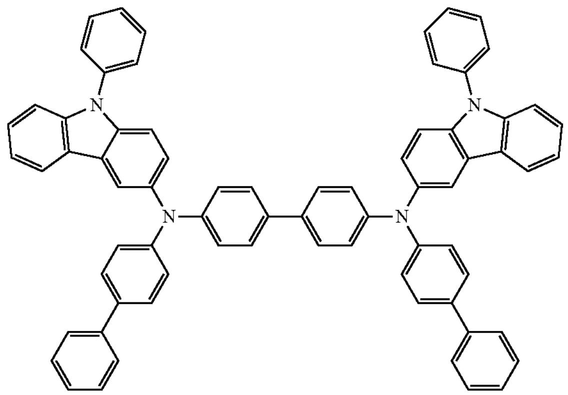

307

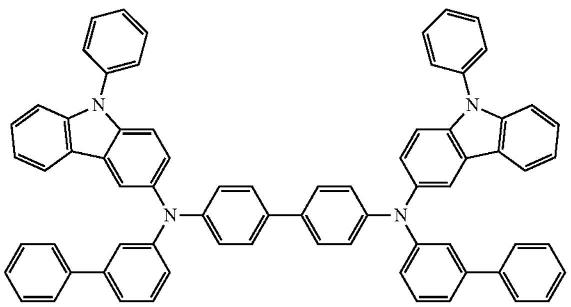

-continued

308

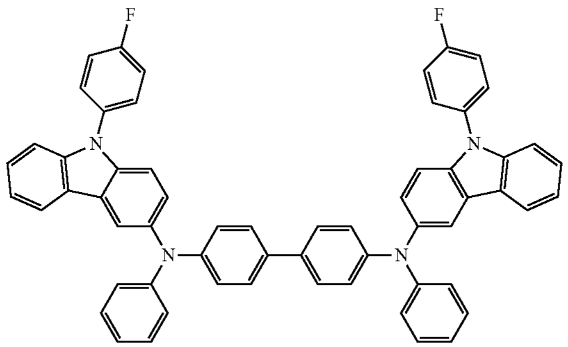

According to an embodiment, in Formula 4 above, $Ar_{111}$ and $Ar_{112}$ are each independently a phenylene group, a naphthylene group, a phenanthrenylene group, or a pyrenylene group; and a phenylene group, a naphthylene group, a phenanthrenylene group, a fluorenyl group, and a pyrenylene group, each substituted with at least one of a phenyl group, a naphthyl group, or an anthracenyl group;

$Ar_{113}$ to $Ar_{116}$ may be each independently selected from, a $C_1$-$C_{10}$ alkyl group substituted with at least one of a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; or

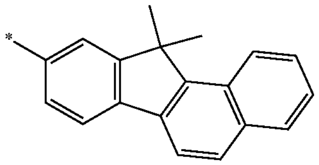, but, they are not limited thereto.

According to another embodiment, the compound of Formula 4 may be any one of the following compounds, but the compound of Formula 4 is not limited thereto:

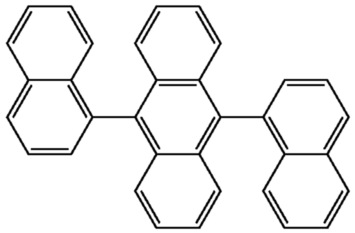

-continued
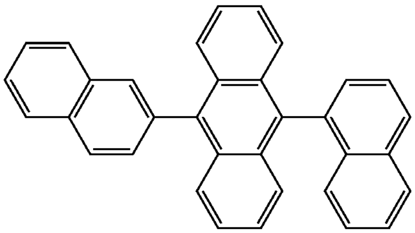
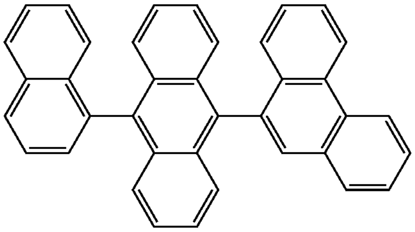
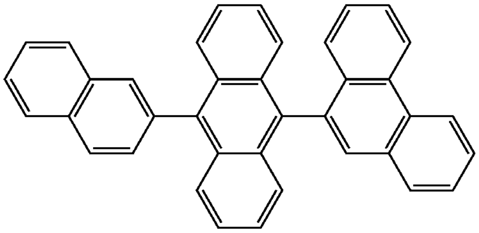
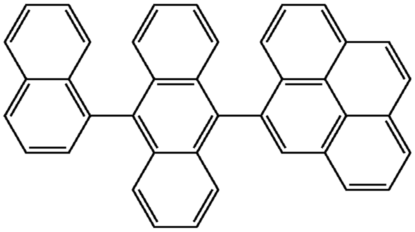
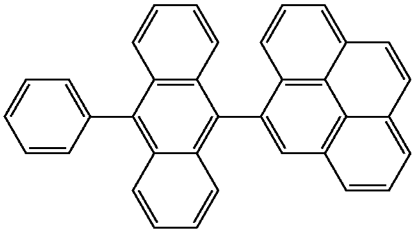
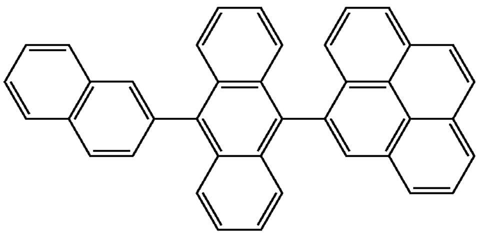
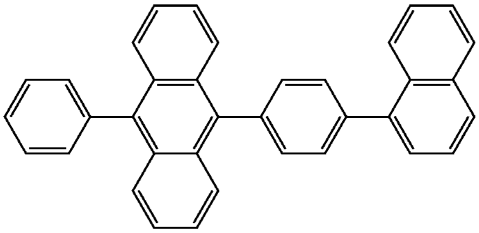
-continued
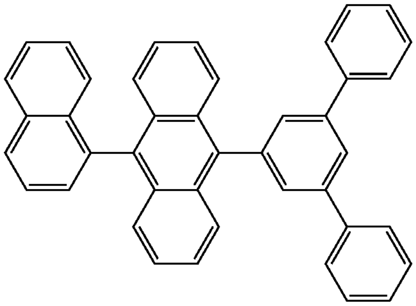
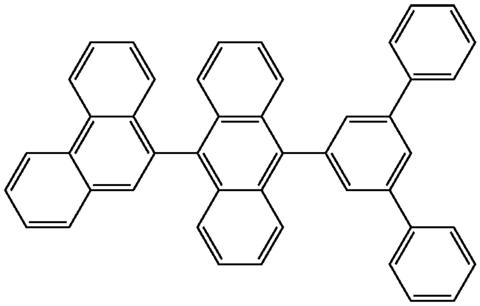
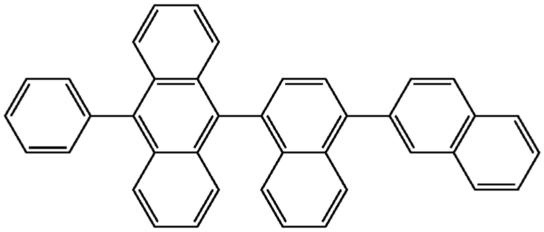
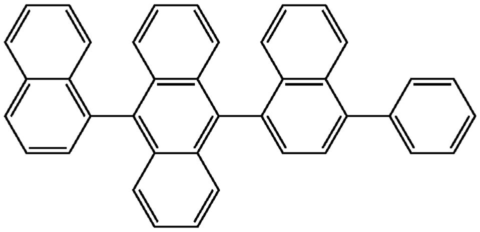
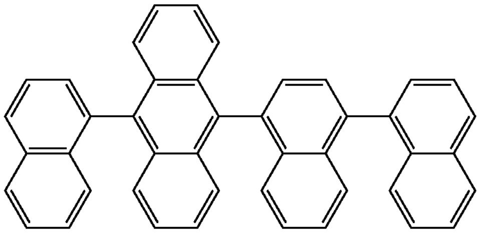
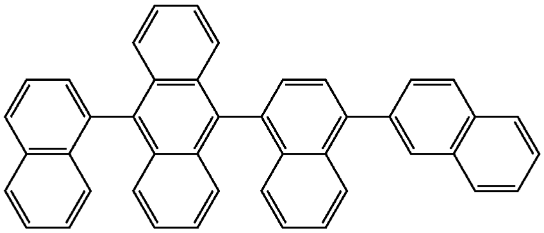

-continued
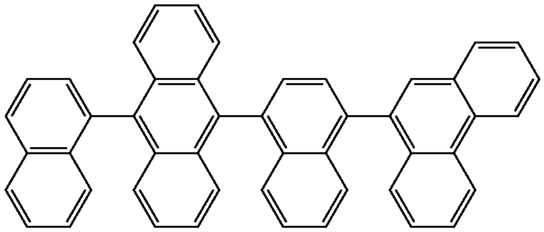
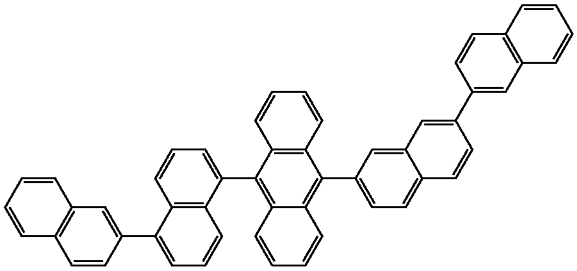
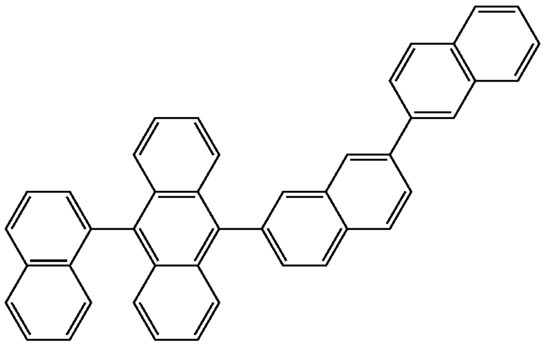
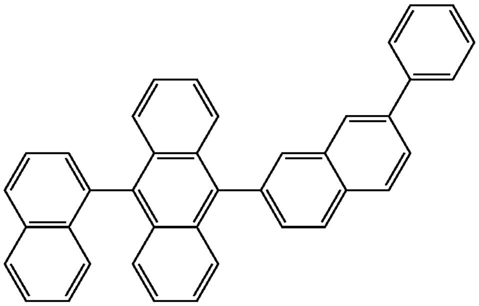
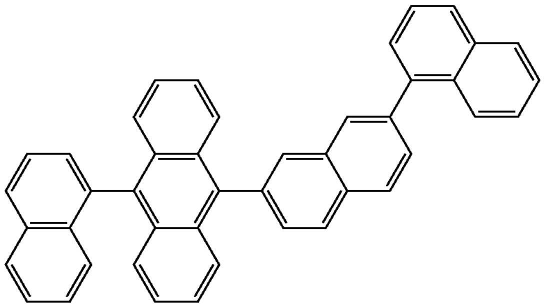
-continued
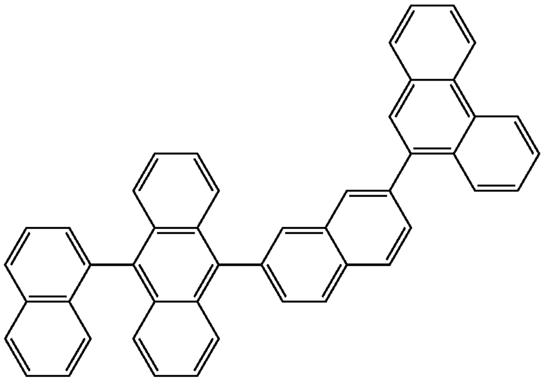
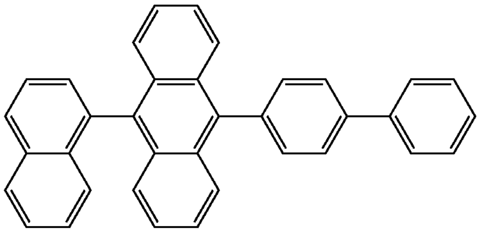
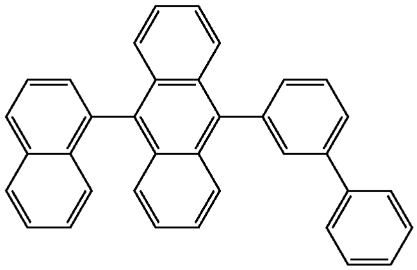
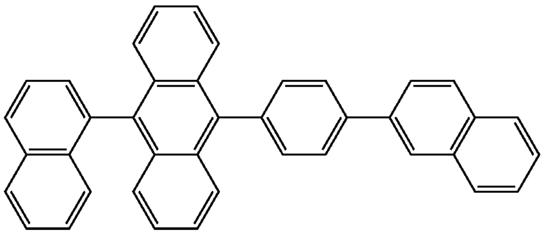
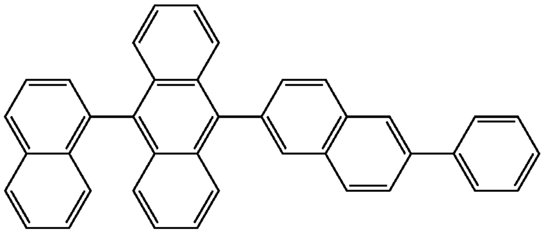
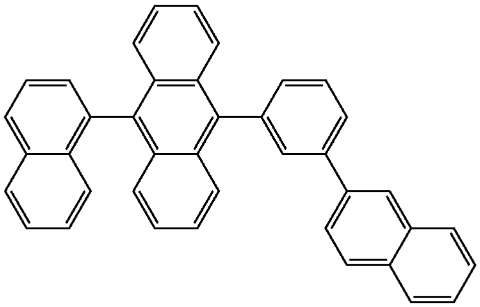

-continued
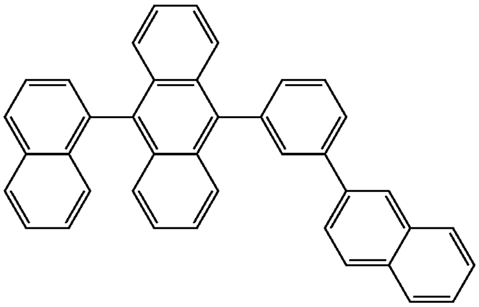
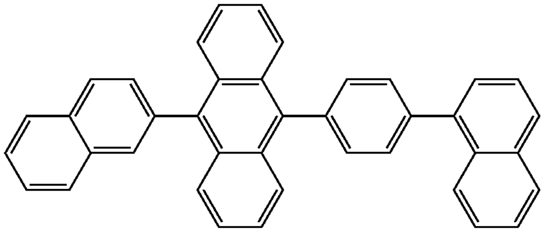
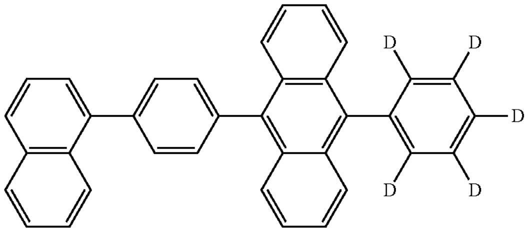
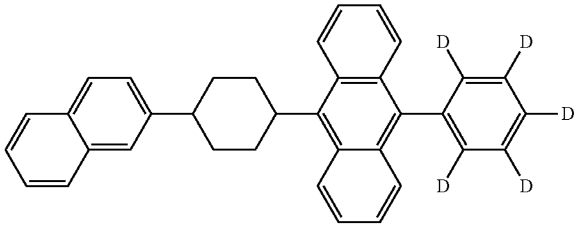
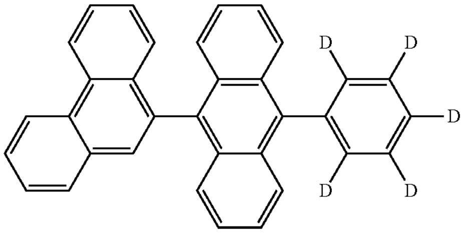
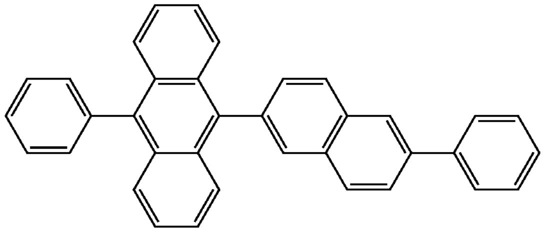
-continued
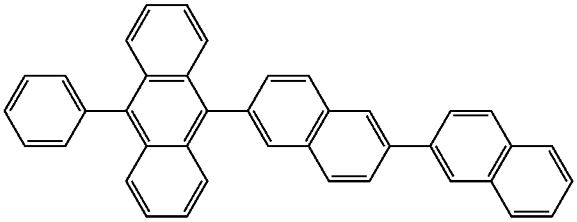
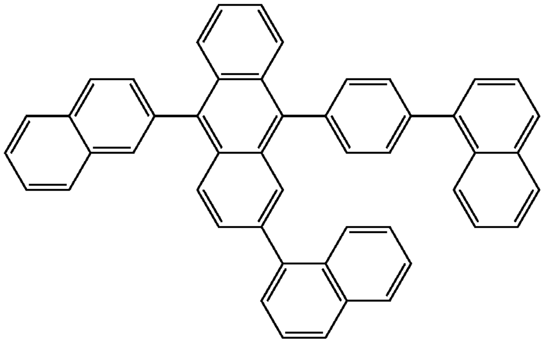
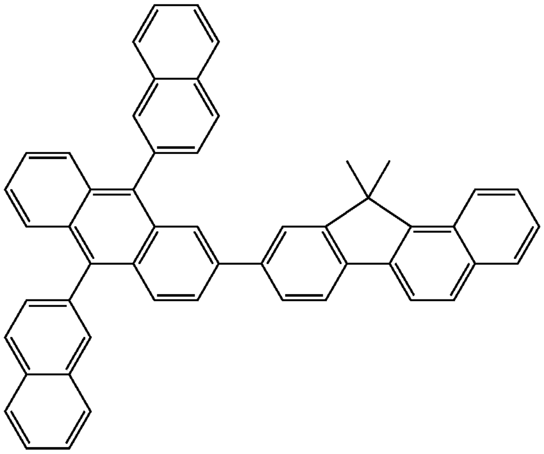
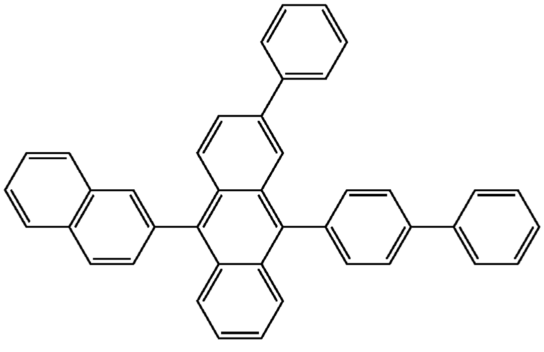

-continued

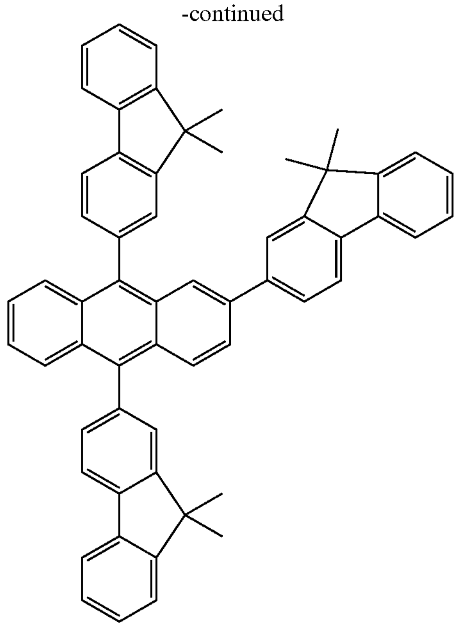

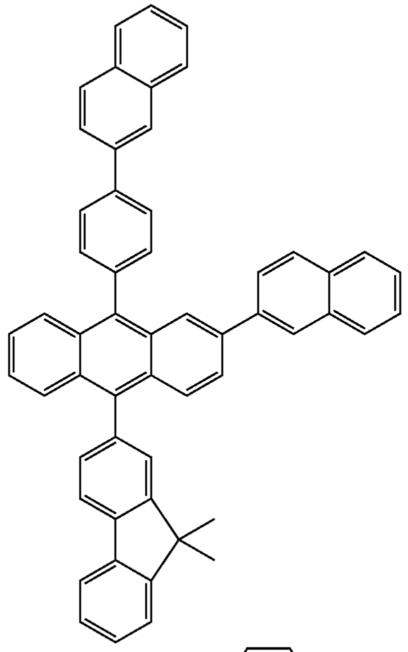

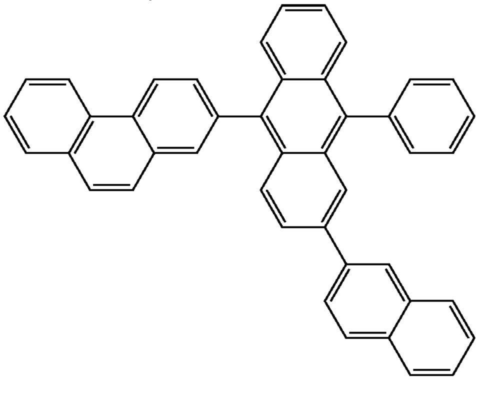

At least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthio group may be selected from a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, and an isoquinolinyl group; and —$N(Q_{11})(Q_{12})$, or —$Si(Q_{13})(Q_{14})(Q_{15})$ (wherein, $Q_{11}$ to $Q_{15}$ are each independently selected from a $C_1$-$C_{60}$ alkyl group, a $C_1$-$C_{60}$ alkoxy group, a $C_6$-$C_{60}$ aryl group, or a $C_2$-$C_{60}$ heteroaryl group).

As used herein, detailed examples of an unsubstituted $C_1$-$C_{60}$ alkyl group (or a $C_1$-$C_{60}$ alkyl group) include a linear or a branched $C_1$-$C_{60}$ alkyl group such as methyl, ethyl, propyl, isobutyl, sec-butyl, pentyl, iso-amyl, and hexyl, and at least one substituent of the substituted $C_1$-$C_{60}$ alkyl group may be selected from a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_3$-$C_{10}$ cycloalkyl group, a $C_3$-$C_{10}$ heterocycloalkyl group, a $C_3$-$C_{10}$ cycloalkenyl group, $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group; and —$N(Q_{11})(Q_{12})$; and —$Si(Q_{11})(Q_{12})(Q_{13})$ (wherein, $Q_{11}$, and $Q_{12}$ are each independently a $C_6$-$C_{60}$ aryl group, or a $C_2$-$C_{60}$ heteroaryl group and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group); but, they are not limited thereto.

As used herein, an unsubstituted $C_1$-$C_{60}$ alkoxy group (or the $C_1$-$C_{60}$ alkoxy group) has a formula of —OA (wherein, A is the unsubstituted $C_1$-$C_{60}$ alkyl group as described above), and specific examples of the unsubstituted $C_1$-$C_{60}$ alkoxy group include methoxy, ethoxy, and iso-propyloxy, and at least one hydrogen atom of the alkoxy group may be substituted with the substituents described above in conjunction with the substituted $C_1$-$C_{60}$ alkyl group.

As used herein, an unsubstituted $C_2$-$C_{60}$ alkenyl group (or the $C_2$-$C_{60}$ alkenyl group) has at least one carbon-carbon double bond in the middle of or at a terminal of a $C_2$-$C_{60}$ alkyl group. Examples of the unsubstituted $C_2$-$C_{60}$ alkenyl group include ethenyl, propenyl, and butenyl. At least one hydrogen atom of the unsubstituted $C_2$-$C_{60}$ alkenyl group may be substituted with the substituents described above in conjunction with the substituted $C_1$-$C_{60}$ alkyl group.

As used herein, an unsubstituted $C_2$-$C_{60}$ alkynyl group (or the $C_2$-$C_{60}$ alkynyl group) has at least one carbon-carbon triple bond in the middle of or at a terminal of the $C_2$-$C_{60}$ alkyl group described above. Examples of the $C_2$-$C_{60}$ alkynyl group include ethynyl and propynyl. At least one hydrogen atom of the alkynyl group may be substituted with the substituents described above in conjunction with the substituted $C_1$-$C_{60}$ alkyl group.

As used herein, an unsubstituted $C_6$-$C_{60}$ aryl group is a monovalent group having a carbocyclic aromatic system having 6 to 60 carbon atoms including at least one aromatic ring, and an unsubstituted $C_6$-$C_{60}$ arylene group is a divalent group having a carbocyclic aromatic system having 6 to 60 carbon atoms including at least one aromatic ring. When the unsubstituted $C_6$-$C_{60}$ aryl group and the unsubstituted $C_6$-$C_{60}$ arylene group include at least two rings, two or more rings may be fused to each other. At least one hydrogen atom of the unsubstituted $C_6$-$C_{60}$ aryl group and the unsubstituted $C_6$-$C_{60}$ arylene group may be substituted with those substituents described above in conjunction with the substituted $C_1$-$C_{60}$ alkyl group.

Examples of a substituted or unsubstituted $C_6$-$C_{60}$ aryl group include a phenyl group, a $C_1$-$C_{10}$ alkyl phenyl group (for example, an ethyl phenyl group), a $C_1$-$C_{10}$ alkyl biphenyl group (for example, an ethyl biphenyl group), a halophenyl group (for example, an o-, m-, and p-fluorophenyl group and a dichlorophenyl group), a dicyanophenyl group, a trifluoromethoxy phenyl group, an o-, m-, and p-tolyl group, an o-, m-, and p-cumenyl group, a mesityl group, a phenoxy phenyl group, an (α,α-dimethyl benzene)phenyl group, an (N,N'-dimethyl)aminophenyl group, an (N,N'-diphenyl)aminophenyl group, a pentalenyl group, an indenyl group, a naphthyl group, a halonaphthyl group (for example, a fluoronaphthyl group), a $C_1$-$C_{10}$ alkyl naphthyl group (for example, a methyl naphthyl group), a $C_1$-$C_{10}$ alkoxy naphthyl group (for example, a methoxy naphthyl group), an anthracenyl group, an azulenyl group, a heptalenyl group, an acenaphthylenyl group, a phenalenyl group, a fluorenyl group, an anthraquinolinyl group, a methyl anthracenyl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, and an ovalenyl group, and examples of the substituted $C_6$-$C_{60}$ aryl group may be inferred based on the substituents described above in conjunction with the substituted $C_1$-$C_{60}$ alkyl group. Examples of the substituted or unsubstituted $C_6$-$C_{60}$ arylene group may be recognized based on the examples of the substituted or unsubstituted $C_6$-$C_{60}$ aryl group.

As used herein, an unsubstituted $C_2$-$C_{60}$ heteroaryl group is a monovalent group having a system formed of at least one aromatic ring that includes at least one heteroatom selected from N, O, P, and S as ring-forming atoms and carbon atoms as other ring atoms, and an unsubstituted $C_2$-$C_{60}$ heteroarylene group is a divalent group having a system formed of at least one aromatic ring that includes at least one heteroatom selected from N, O, P, and S as ring-forming atoms and carbon atoms as other ring atoms. Here, when the unsubstituted $C_2$-$C_{60}$ heteroaryl group and the unsubstituted $C_2$-$C_{60}$ heteroarylene group include two or more rings, the two or more rings may be fused to each other. At least one hydrogen atom of the unsubstituted $C_2$-$C_{60}$ heteroaryl group and the unsubstituted $C_2$-$C_{60}$ heteroarylene group may be substituted with those substituents described above in conjunction with the substituted $C_1$-$C_{60}$ alkyl group.

Examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, an imidazopyrimidinyl group. Examples of the unsubstituted $C_2$-$C_{60}$ heteroarylene group may be recognized based on the examples of a substituted or unsubstituted $C_2$-$C_{60}$ arylene group.

The substituted or unsubstituted $C_6$-$C_{60}$ aryloxy group is —$OA_2$ (wherein, $A_2$ is a substituted or unsubstituted $C_6$-$C_{60}$ aryl group) and the substituted or unsubstituted $C_6$-$C_{60}$ arylthio group is —$SA_3$ (wherein, $A_3$ is the substituted or unsubstituted $C_6$-$C_{60}$ aryl group).

At least one of the hole-transporting region and interlayer may further include a p-dopant.

The amount of additional p-dopant may be selected from the range of about 0.1 wt % to about 20 wt %, for example, about 0.5 wt % to about 15 wt % based on 100 wt % of the total weight of the hole-transporting region and the inter-layer, respectively. When the amount of the additional p-dopant is in the range above, an excess injection of the holes from the first electrode to the blue EML may be prevented to improve the lifespan of an OLED.

The p-dopant may be selected from materials that facilitate hole-transportation.

For example, the p-dopant may be one of a quinone derivative, a metal oxide, and a cyano group-containing compound, but is not limited thereto. Non-limiting examples of the p-dopant are quinone derivatives such as tetracyano-quinonedimethane (TCNQ) and 2,3,5,6-tetrafluoro-tetra-cyano-1,4-benzoquinonedimethane (F4-TCNQ); metal oxides such as tungsten oxide and molybdenum oxide; and cyano-group-containing compounds such as Compound 200 below.

<Compound 200>

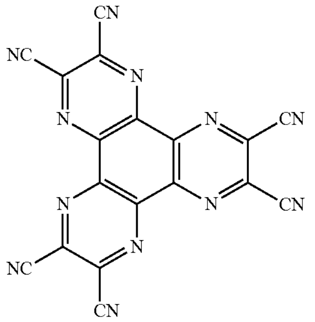

<F4-TCNQ>

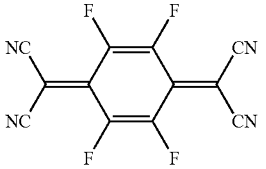

The blue EML is a host and may further include a dopant in addition to the fourth compound represented by Formula 4 described above. The dopant may be a blue fluorescent dopant that emits blue light according to a fluorescent emission mechanism.

An amine-based compound represented by Formula 500 below may be used as the dopant.

$$Ar_{200}—[N(Ar_{201})(Ar_{202})]_{x1}$$ <Formula 500>

In Formula 500, $Ar_{200}$ is selected from anthracene, pyrene, chrysene, phenanthrene, and benzofluorene; and anthracene, pyrene, chrysene, phenanthrene, and benzo-fluorene, each substituted with at least one of, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, $C_1$-$C_{20}$ alkyl group, or $C_1$-$C_{20}$ alkoxy group;

a $C_1$-$C_{20}$ alkyl group or a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, and a phosphoric acid or a salt thereof;

a $C_6$-$C_{20}$ aryl group or a $C_2$-$C_{20}$ heteroaryl group; and a $C_6$-$C_{20}$ aryl group or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group.

Descriptions of $Ar_{201}$ and $Ar_{202}$ are each independently referred to in the description of $Ar_{11}$.

x1 is an integer of 1 to 3, for example, 1 or 2.

For example, in Formula 500, $Ar_{201}$ and $Ar_{202}$ may be each independently represented by one of Formulae 12-1 to 12-22 above, but they are not limited thereto.

When the blue EML includes the host (a compound of Formula 4) and the dopant, the amount of the dopant may be selected from a range of about 0.01 parts by weight to about 15 parts by weight based on 100 parts by weight of the host, but the amount is not limited thereto.

A thickness of the blue EML may be about 100 Å to about 1000 Å, for example, about 200 Å to about 600 Å. When the thickness of the blue EML satisfies the range above, the blue EML may show excellent emission characteristics without a substantial increase in driving voltage.

When the electron-transporting region includes an ETL, the ETL may be formed on the blue EML by using any of a variety of methods, for example, vacuum deposition, spin coating, and casting. When the ETL is formed by using vacuum deposition or spin coating, the deposition and coating conditions may be similar to those for the formation of the HIL, though the deposition and coating conditions may vary according to a material that is used to form the ETL.

Any known electron transporting material that may stably transport electrons injected from the second electrode may be used as an ETL material. Non-limiting examples of the ETL material are quinoline derivatives such as tris(8-qui-nolinorate)aluminum ($Alq_3$), TAZ (see Formula below), BAlq (see Formula below), beryllium bis(benzoquinolin-10-olate) ($Bebq_2$), 9,10-di(naphthalene-2-yl)anthracene (ADN) (see Formula below), Compound 201, and Compound 202, but the ETL material is not limited thereto.

TAZ

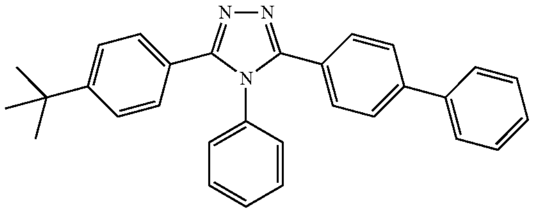

-continued

BAlq

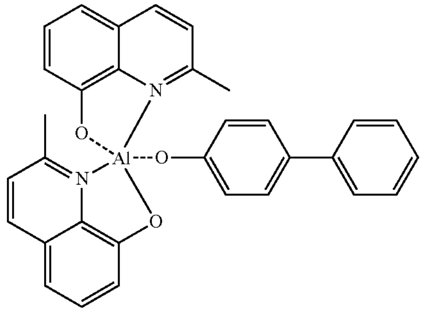

<Compound 201>

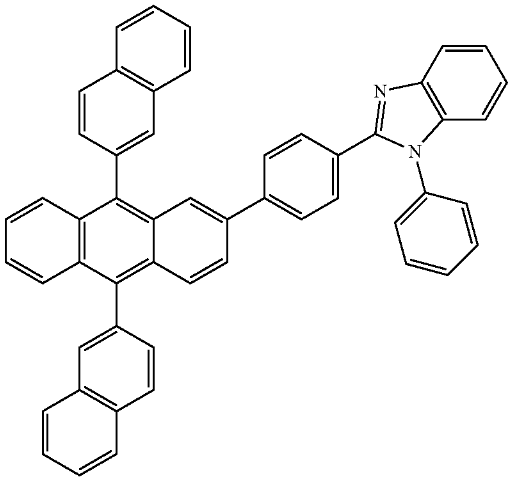

<Compound 202>

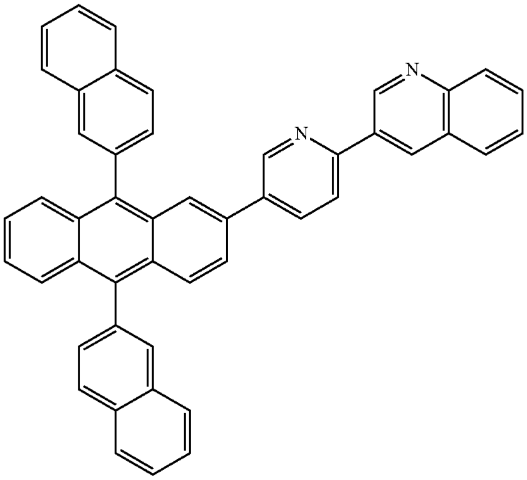

BCP

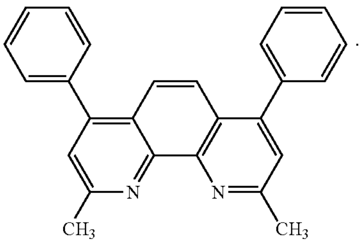

A thickness of the ETL may be about 100 Å to about 1000 Å, for example, about 150 Å to about 500 Å. When the thickness of the ETL is within the range above, the ETL may have good electron transporting ability without a substantial increase in driving voltage.

The ETL may further include a metal-containing material in addition to the electron-transporting organic compound described above.

The metal-containing material may include a Li complex. Non-limiting examples of the Li complex include lithium quinolate (LiQ) and Compound 203:

<Compound 203>

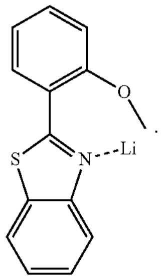

When the electron-transporting region includes an EIL, the EIL may be formed on the ETL. A material for forming the EIL may be a known material for forming the EIL such as LiF, NaCl, CsF, $Li_2O$, or BaO. The deposition and coating conditions for forming the EIL may be similar to those for the formation of the HIL, though the deposition and coating conditions may vary according to the compound that is used to form the EIL.

A thickness of the EIL may be from about 1 Å to about 100 Å, and in some embodiments, may be from about 3 Å to about 90 Å. When the thickness of the EIL is within these ranges, the EIL may have satisfactory electron injecting ability without a substantial increase in driving voltage.

A second electrode is disposed on the EIL. A material for forming the second electrode may be a metal, an alloy, an electro-conductive compound, which have a low work function, or a combination thereof. In greater detail, lithium (Li), magnesium (Mg), aluminum (Al), aluminum (Al-lithium), calcium (Ca), magnesium-indium (Mg—In), magnesium-silver (Mg—Ag), or the like may be used as the material for forming the second electrode. In some embodiments, to manufacture a top-emission light-emitting device, a transmission-type second electrode may be formed of indium tin oxide (ITO) or indium zinc oxide (IZO).

The OLED has been described with reference to FIG. 1, but the OLED is not limited thereto.

For example, a HBL may be formed between the EML and the ETL by using vacuum deposition, spin coating, casting, LB deposition, or the like, in order to prevent diffusion of triplet excitons or holes into the ETL. When the HBL is formed by using vacuum deposition or spin coating, the conditions for deposition and coating may be similar to those for the formation of the HIL, although the conditions for deposition and coating may vary according to the material that is used to form the HBL. Known hole blocking materials may be used, and examples of these hole blocking materials include oxadiazole derivatives, triazole derivatives, and phenanthroline derivatives. For example, BCP, as shown below, may be used as a hole blocking layer material.

BCP

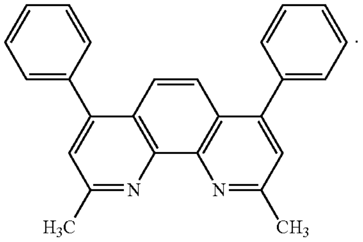

A thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

To evaluate efficiency, driving voltage, brightness, and color purity of the OLED, an OLED 11 was manufactured according to the method described below.

An ITO glass substrate was cut to a size of 50 mm×50 mm×0.5 mm, and the ITO glass substrate was ultrasonically washed using isopropyl alcohol and pure water for 30 minutes each, followed by irradiation by UV and exposure to ozone for cleaning for about 10 minutes. Compound 301 was vacuum deposited on the ITO glass substrate to form an HIL having a thickness of 600 Å, and NPB was vacuum deposited on the HIL to form an HTL having a thickness of 550 Å, thereby forming a hole-transporting region. Thereafter, Compound 722 was vacuum deposited on the hole-transporting region to form an interlayer having a thickness of 50 Å (5 nm), and then Compound H1 and Compound D1 (wherein TMS in Compound D1 represents trimethylsilyl group) were co-deposited in a weight ratio of 200:3 to form a blue EML having a thickness of 200 Å. Compound 201 was vacuum deposited on the blue EML in a thickness of 300 Å to form an ETL, and LiQ was vacuum deposited on the ETL to form an EIL having a thickness of 10 Å, and then Mg and Ag were vacuum deposited in a thickness of 120 Å on the EIL, to form a second electrode, sequentially, thereby manufacturing the OLED 11.

301

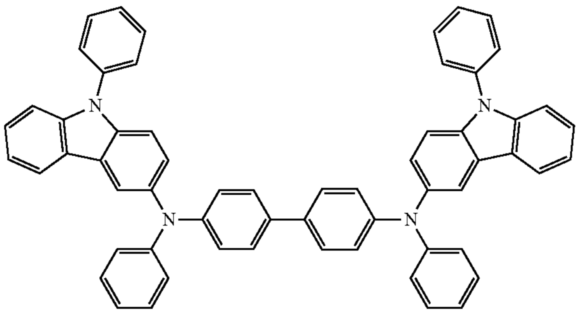

-continued

722

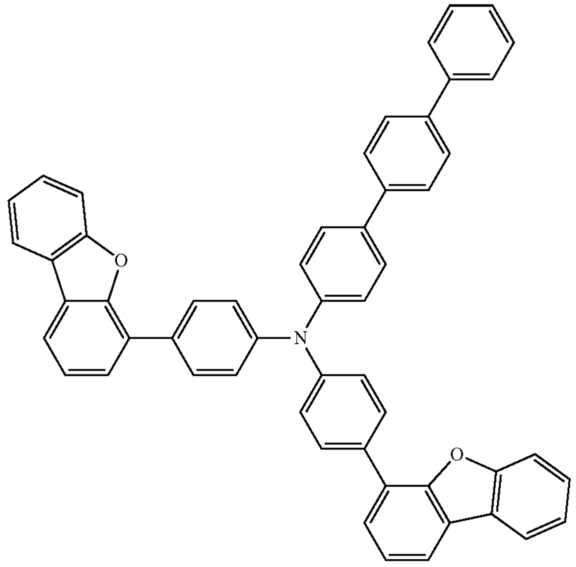

H1

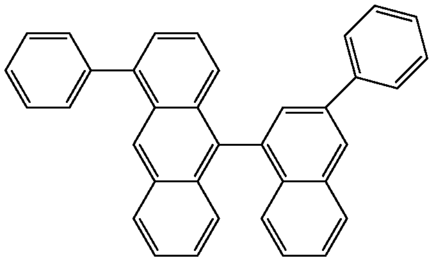

D1

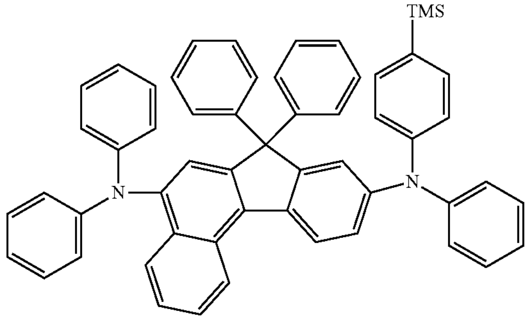

-continued

201

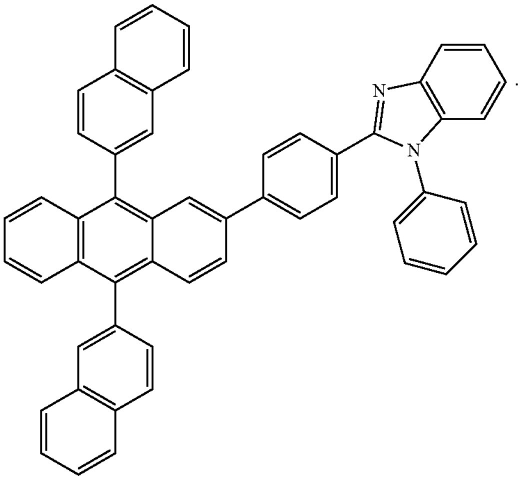

OLEDs 12 to 15 were manufactured in the same manner as OLED 11 except that the thickness of the interlayer was changed to 10 nm, 20 nm, 30 nm, and 3 nm, respectively.

Meanwhile, OLED 6 was manufactured in the same manner as OLED 1 except that the interlayer was not formed.

As described above, according to the one or more of the above embodiments of the present invention, the OLED has a low driving voltage, high brightness, and high efficiency. By using the OLED, a superior high definition display device may be manufactured.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting device comprising:

a first electrode;

a second electrode disposed opposite to the first electrode;

a blue emission layer disposed between the first electrode and the second electrode;

a hole-transporting region disposed between the first electrode and the blue emission layer;

an electron-transporting region disposed between the blue emission layer and the second electrode; and an interlayer disposed between the blue emission layer and the hole-transporting region; wherein the interlayer comprises a compound represented by Formula 9 below, the hole-transporting region comprises at least one selected from a compound represented by Formula 2 below and a compound represented by Formula 3 below, and the blue emission layer comprises a compound represented by Formula 4 below <Formula 9>

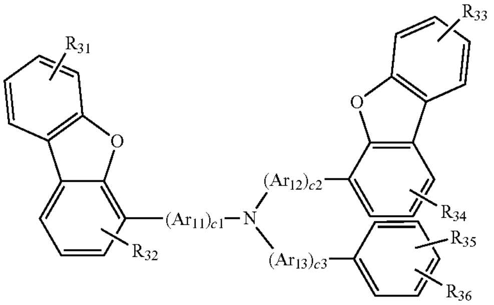

<Formula 2>

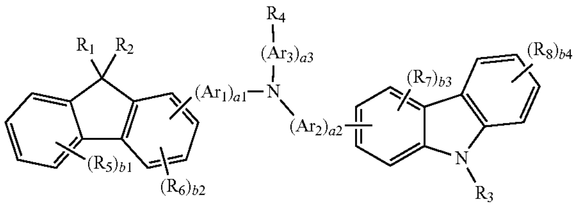

<Formula 3>

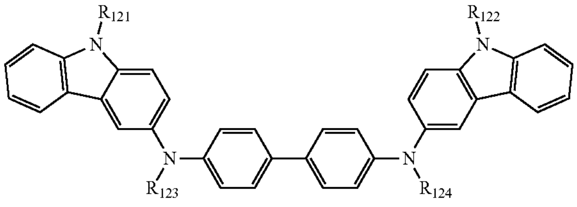

<Formula 4>

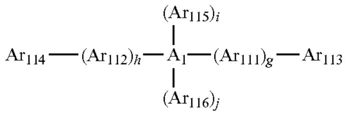

wherein, in Formulae 9, 3, and 4, $Ar_{11}$, $Ar_{12}$, $Ar_{13}$, $Ar_{111}$, and $Ar_{112}$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

c1 to c3 are each independently an integer of 1 to 5;

$Ar_{113}$ to $Ar_{116}$ are each independently selected from a hydrogen, a deuterium, a halogen atom, a hydroxyl group, a cyano group, a nitro group, an amino group, an amidino group, a hydrazine, a hydrazone, a carboxyl acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_2$-$C_{60}$ heteroaryl group, or —$Si(Q_3)(Q_4)(Q_5)$ (wherein, $Q_3$ to $Q_5$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group);

$R_{31}$ to $R_{36}$ are each independently:

a hydrogen, a deuterium, a halogen atom, a hydroxyl group, a cyano group, a nitro group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group and a $C_2$-$C_{20}$ heteroaryl group; or a $C_6$-$C_{20}$ aryl group and a $C_2$-$C_{20}$ heteroaryl group, each substituted with at least one of a deuterium, a halogen atom, a hydroxyl group, a cyano group, a nitro group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a dibenzofuranyl group, a dibenzothiophenyl group, a phenyl carbazolyl group, a pyridinyl group, a pyrimidinyl group, a pyrazinyl group, a pyridazinyl group, a triazinyl group, a quinolinyl group, or an isoquinolinyl group, $A_1$ is anthracene or pyrene, g, h, i, and j are each independently an integer of 0 to 4, provided that, the case of g, h, i, and j being 0 is excluded, and wherein, in Formula 2, $Ar_1$ to $Ar_3$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

a1 to a3 are each independently an integer of 0 to 5;

$R_1$ to $R_8$ are each independently selected from hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group;

b1 and b4 are each independently an integer of 1 to 4;

b2 and b3 are each independently an integer of 1 to 3; and in Formula 3, $R_{121}$ to $R_{124}$ are each independently selected from hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group.

2. The organic light-emitting device of claim 1, wherein the blue emission layer emits blue light by a fluorescent emission mechanism.

3. The organic light-emitting device of claim 1, wherein the interlayer directly contacts each of the blue emission layer and the hole-transporting region.

4. The organic light-emitting device of claim 1, wherein, in Formulae 9 and 4, $Ar_{11}$, $Ar_{12}$, $Ar_{13}$, $Ar_{111}$, and $Ar_{112}$ are each independently, a phenylene group, a pentalenylene group, an indenylene group, a naphthylene group, an azulenylene group, a heptalenylene group, an indacenylene group, an acenaphthylene group, a fluorenylene group, spiro-fluorenylene group, phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, benzofuranylene group, thiophenylene group, benzothiophenylene group, a thiazolylene group, an isothiazolylene group, benzothiazolylene group, an isoxazolylene group, an oxazolylene group, a triazolylene group, a tetrazolylene group, an oxadiazolylene group, a triazinylene group, a benzooxazolylene group, dibenzofuranylene group, dibenzothiophenylene group, or a benzocarbazolyl group; or a phenylene group, a pentalenylene group, an indenylene group, a naphthylene group, an azulenylene group, a heptalenylene group, an indacenylene group, an acenaphthylene group, a fluorenylene group, spiro-fluorenylene group, phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzooxazolylene group, a benzoimidazolylene group, a furanylene group, benzofuranylene group, thiophenylene group, benzothiophenylene group, a thiazolylene group, an isothiazolylene group, benzothiazolylene group, an isoxazolylene group, an oxazolylene group, a triazolylene group, a tetrazolylene group, an oxadiazolylene group, a triazinylene group, a benzooxazolylene group, dibenzofuranylene group, dibenzothiophenylene group, or a benzocarbazolyl group, each substituted with at least one substituent selected from, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, and a phosphoric acid or a salt thereof;

a $C_6$-$C_{20}$ aryl group or a $C_2$-$C_{20}$ heteroaryl group;

a $C_6$-$C_{20}$ aryl group or $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group;

—$N(Q_{11})(Q_{12})$ or —$Si(Q_{13})(Q_{14})(Q_{15})$ (wherein, $Q_{11}$ to $Q_{15}$ are each independently selected from a $C_1$-$C_{20}$ alkyl group, a $C_1$-$C_{20}$ alkoxy group, a $C_6$-$C_{20}$ aryl group, or a $C_2$-$C_{20}$ heteroaryl group).

5. The organic light-emitting device of claim 1, wherein, in Formulae 9 and 4, $Ar_{11}$, $Ar_{12}$, $Ar_{13}$, $Ar_{111}$, and $Ar_{112}$ are each independently represented by any one of Formulae 10-1 to 10-24:

Formula 10-1

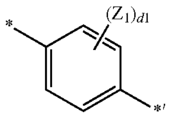

Formula 10-2

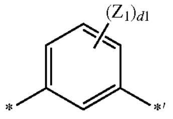

-continued

Formula 10-3

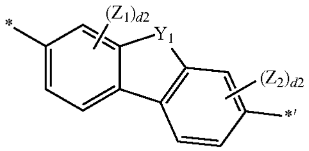

Formula 10-4

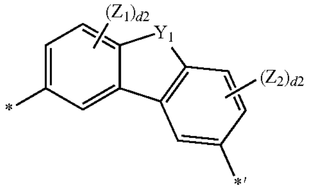

Formula 10-5

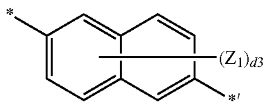

Formula 10-6

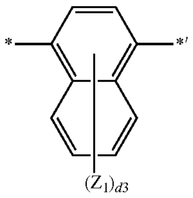

Formula 10-7

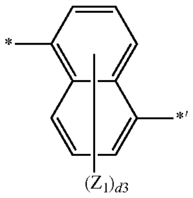

Formula 10-8

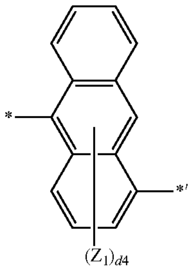

Formula 10-9

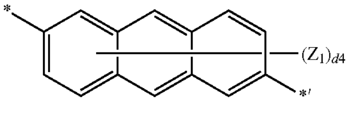

Formula 10-10

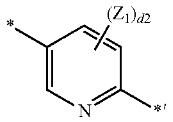

Formula 10-11

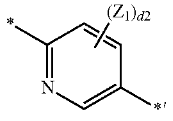

-continued

Formula 10-12

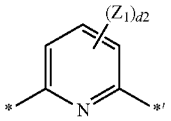

Formula 10-13

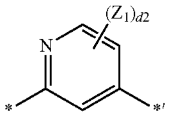

Formula 10-14

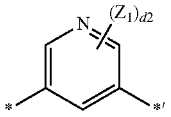

Formula 10-15

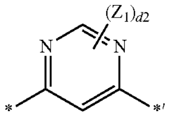

Formula 10-16

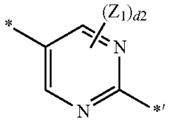

Formula 10-17

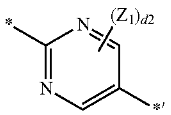

Formula 10-18

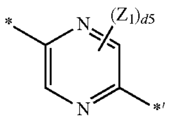

Formula 10-19

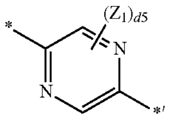

Formula 10-20

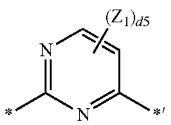

Formula 10-21

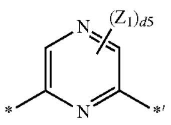

Formula 10-22

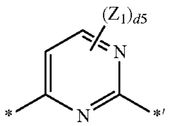

Formula 10-23

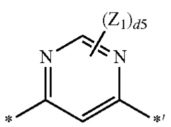

-continued

Formula 10-24

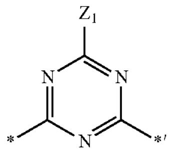

wherein, in Formulae 10-1 to 10-24 above, $Y_1$ is O, S, $C(R_{21})(R_{22})$, or $N(R_{23})$;

$Z_1$, $Z_2$, and $R_{21}$ to $R_{23}$ are each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group or a $C_2$-$C_{20}$ heteroaryl group;

a $C_6$-$C_{20}$ aryl group or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group; and —$N(Q_{11})(Q_{12})$, or —$Si(Q_{13})(Q_{14})(Q_{15})$ (wherein, $Q_{11}$ to $Q_{15}$ are each independently selected from a $C_1$-$C_{20}$ alkyl group, a $C_1$-$C_{20}$ alkoxy group, a $C_6$-$C_{20}$ aryl group, or a $C_2$-$C_{20}$ heteroaryl group);

wherein d1 is an integer of 1 to 4;

d2 is an integer of 1 to 3;

d3 is an integer of 1 to 6;

d4 is an integer of 1 to 8;

d5 is 1 or 2; and

* and *' represent connections to $Ar_{113}$, $Ar_{114}$, N, or $A_1$ in Formulas 1 and 4.

6. The organic light-emitting device of claim 5, wherein $Z_1$, $Z_2$, and $R_{21}$ to $R_{23}$ are each independently selected from a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group;

—$N(Q_{11})(Q_{12})$ or —$Si(Q_{13})(Q_{14})(Q_{15})$ (wherein, $Q_{11}$ to $Q_{15}$ are each independently a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group).

7. The organic light-emitting device of claim 1, wherein, in Formulae 9 and 4, $Ar_{11}$, $Ar_{12}$, $Ar_{13}$, $Ar_{111}$, and $Ar_{112}$ are each independently represented by any one of Formulae 11-1 to 11-11:

Formula 11-1

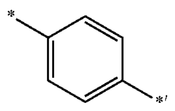

Formula 11-2

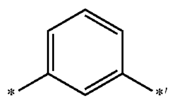

Formula 11-3

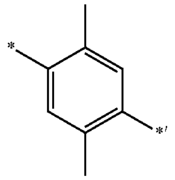

Formula 11-4

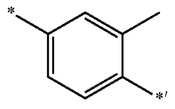

-continued

Formula 11-5

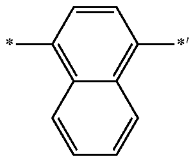

Formula 11-6

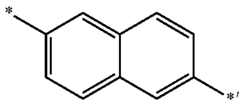

Formula 11-7

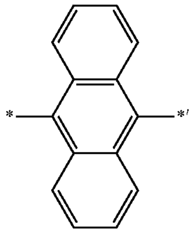

Formula 11-8

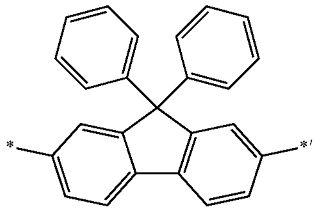

Formula 11-9

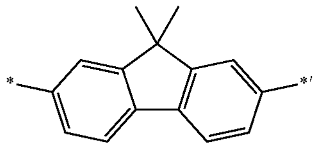

Formula 11-10

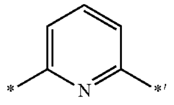

Formula 11-11

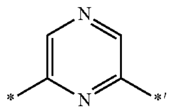

* and *' represent connections to $Ar_{113}$, $Ar_{114}$, N, or $A_1$ in Formulas 1 and 4.

8. The organic light-emitting device of claim 1, wherein, in Formula 4, $Ar_{113}$ to $Ar_{116}$ are each independently selected from, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, or a benzocarbazolyl group; or a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, or a benzocarbazolyl group, each substituted with at least one substituent of, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group or a $C_2$-$C_{20}$ heteroaryl group;

a $C_6$-$C_{20}$ aryl group or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group;

—$N(Q_{11})(Q_{12})$, or —$Si(Q_{13})(Q_{14})(Q_{15})$ (wherein, $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group).

9. The organic light-emitting device of claim 1, wherein, in Formula 4, $Ar_{113}$ to $Ar_{116}$ are each independently selected from any one of Formulae 12-1 to 12-22:

Formula 12-1

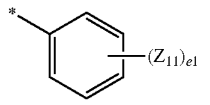

Formula 12-2

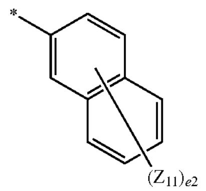

Formula 12-3

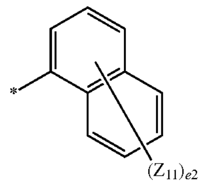

Formula 12-4

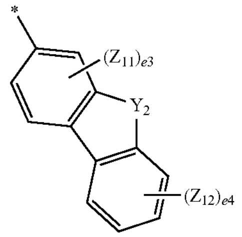

Formula 12-5

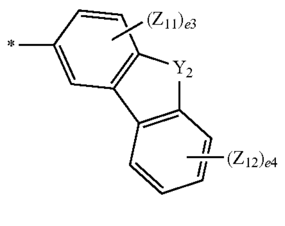

Formula 12-6

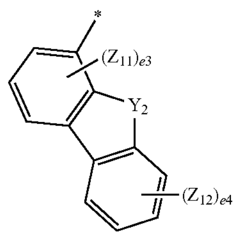

-continued

Formula 12-7

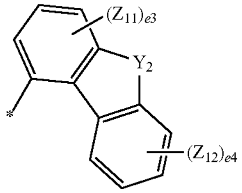

Formula 12-8

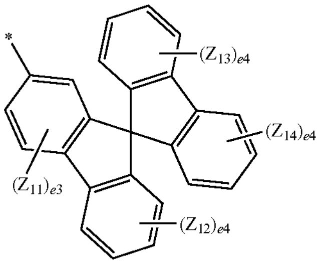

Formula 12-9

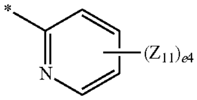

Formula 12-10

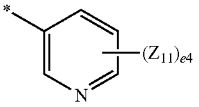

Formula 12-11

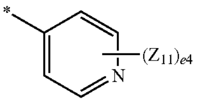

Formula 12-12

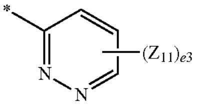

Formula 12-13

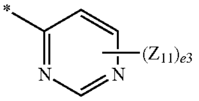

Formula 12-14

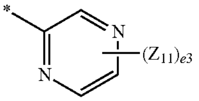

Formula 12-15

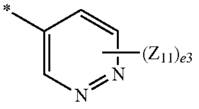

Formula 12-16

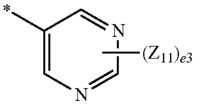

Formula 12-17

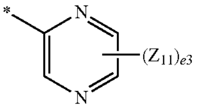

-continued

Formula 12-18

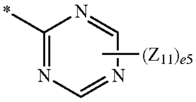

Formula 12-19

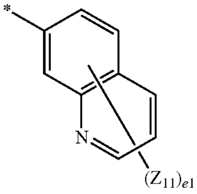

Formula 12-20

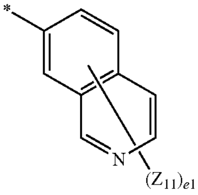

Formula 12-21

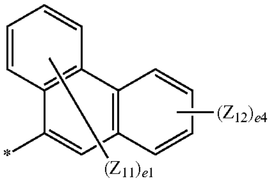

Formula 12-22

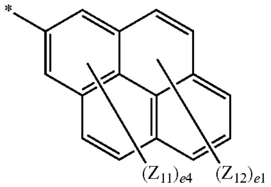

wherein, in Formulae 12-1 to 12-22, $Y_2$ is O, S, $C(R_{25})(R_{26})$, or $N(R_{27})$;

$Z_{11}$ to $Z_{14}$ and $R_{25}$ to $R_{27}$ are each independently selected from, a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group or a $C_2$-$C_{20}$ heteroaryl group;

a $C_6$-$C_{20}$ aryl group or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group;

—N($Q_{11}$)($Q_{12}$); or —Si($Q_{13}$)($Q_{14}$)($Q_{15}$) (wherein, $Q_{11}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group); wherein, e1 is an integer of 1 to 5;

e2 is an integer of 1 to 7;

e3 is an integer of 1 to 3;

e4 is an integer of 1 to 4;

e5 is 1 or 2; and

* represents a connection to phenyl, $Ar_{111}$, $Ar_{112}$, N, or $A_1$ in Formula 4.

10. The organic light-emitting device of claim 1, wherein, in Formula 4, $Ar_{113}$ to $Ar_{116}$ are each independently represented by any one of Formulae 13-1 to 13-19:

Formula 13-1

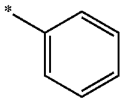

Formula 13-2

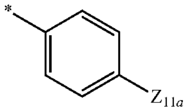

Formula 13-3

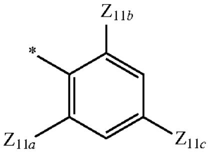

Formula 13-4

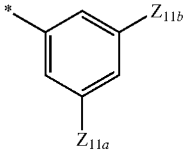

Formula 13-5

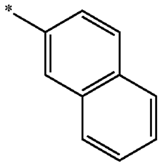

Formula 13-6

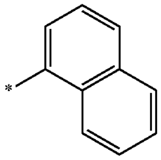

Formula 13-7

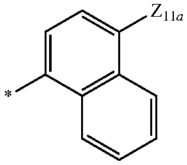

-continued

Formula 13-8

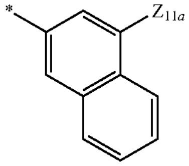

Formula 13-9

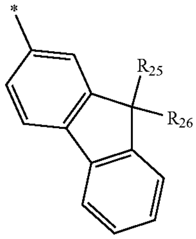

Formula 13-10

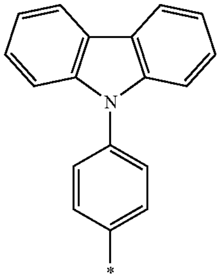

Formula 13-11

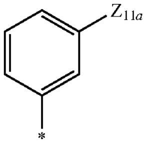

Formula 13-12

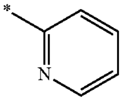

Formula 13-13

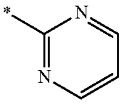

Formula 13-14

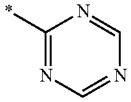

Formula 13-15

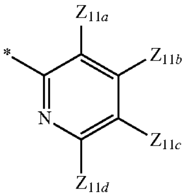

Formula 13-16

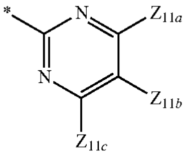

-continued

Formula 13-17

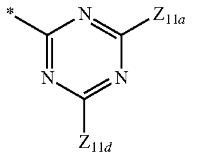

Formula 13-18

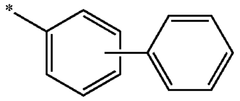

Formula 13-19

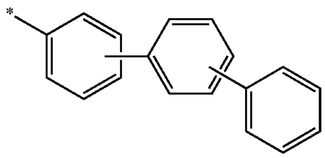

wherein, in Formulae 131 to 13-19, $Z_{11a}$ to $Z_{11c}$, $R_{25}$, and $R_{26}$ are each independently selected from, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group; and a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group and wherein * represents a connection to phenyl, N, $Ar_{111}$, $Ar_{112}$ or $A_1$.

11. The organic light-emitting device of claim 10, wherein, in Formulae 13-1 to 13-19, $Z_{11a}$ to $Z_{11e}$, $R_{25}$, and $R_{26}$ are each independently selected from a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, or an isoquinolinyl group; or a phenyl group, a naphthyl group, an anthracenyl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group.

12. The organic light-emitting device of claim 1, wherein the compound of Formula 9 comprises at least one of Compounds 721 to 730:

721

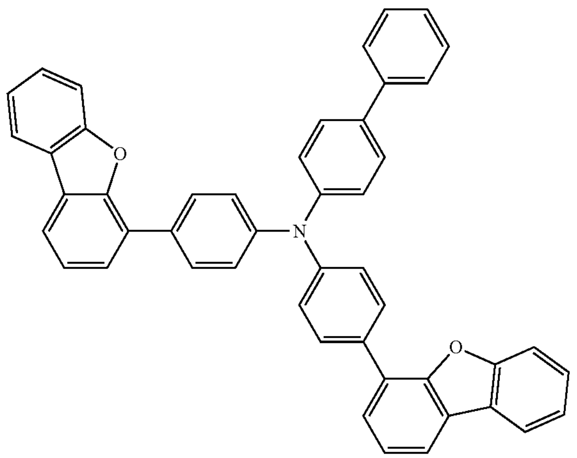

-continued
722
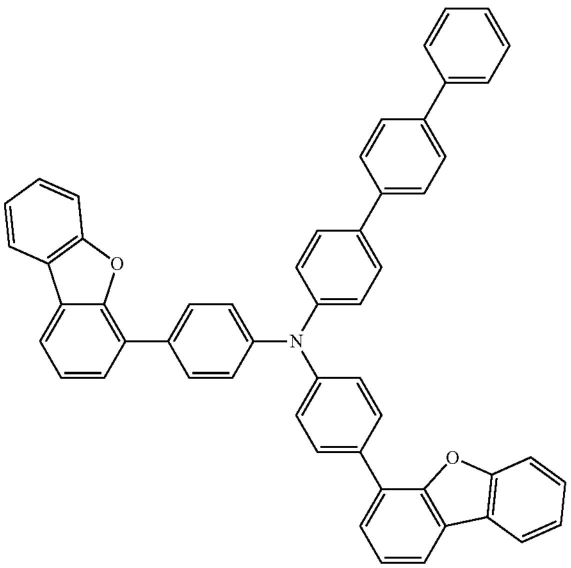
723
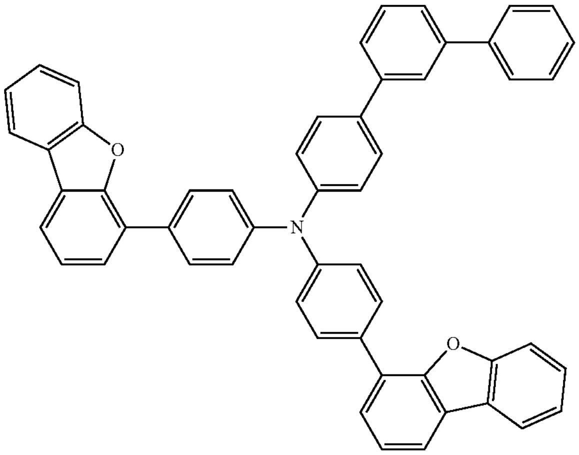
724
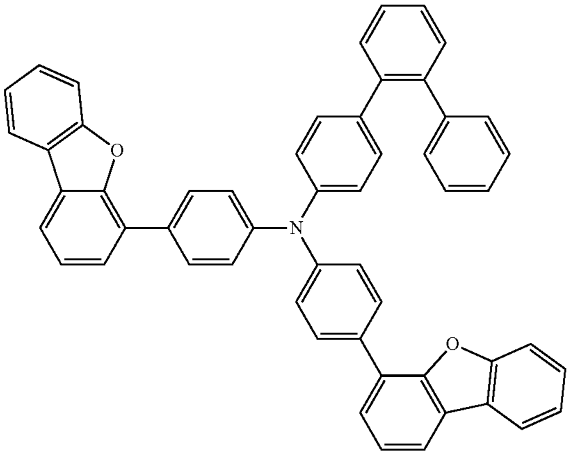
-continued
725
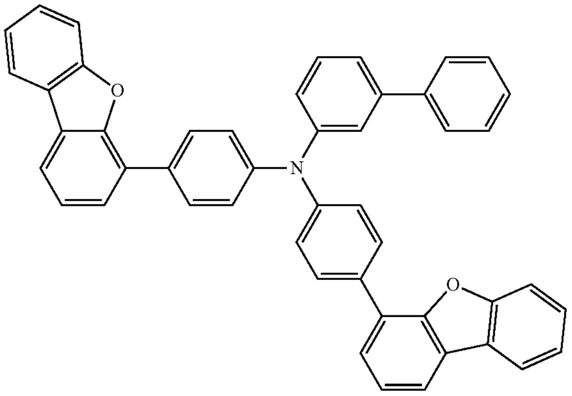
726
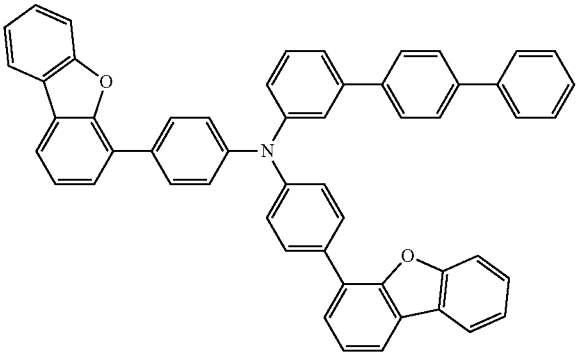
727
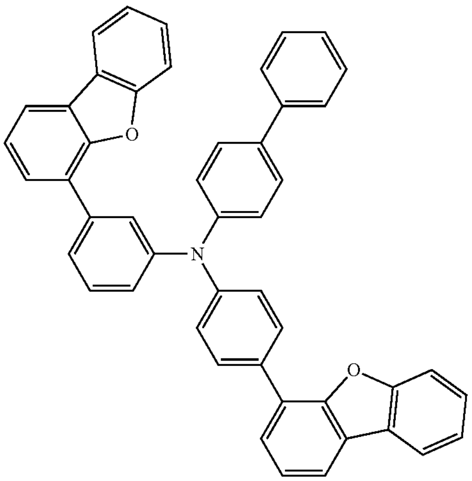

-continued

728

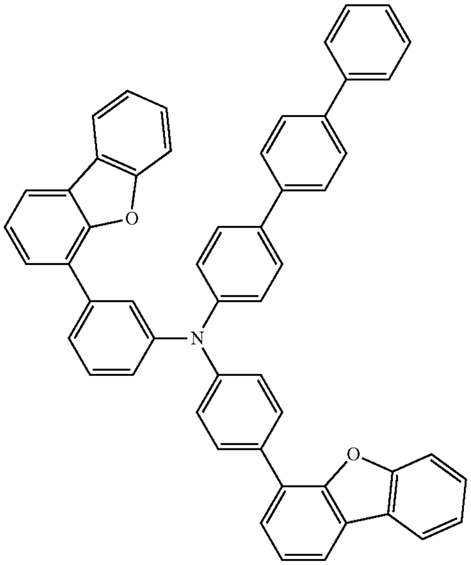

729

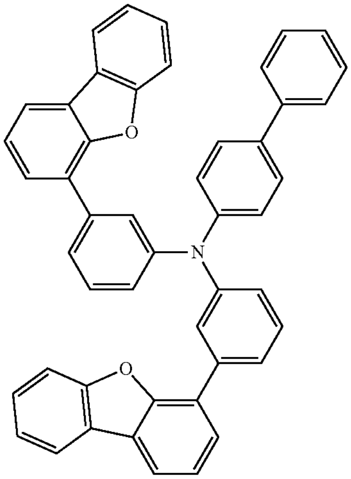

730

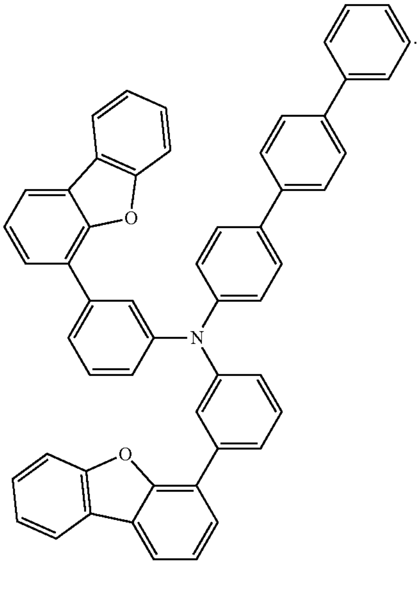

13. The organic light-emitting device of claim 1, wherein the hole-transporting region further comprises at least one of N,N'-diphenyl-N,N'-bis-[4-(phenyl-m-tolyl-amino)-phenyl]-biphenyl-4,4'-diamine (DNTPD), 4,4',4"-tris (3-methylphenylphenylamino) triphenylamine (m-MTDATA), N,N'-di(1-naphthyl)-N,N'-diphenylbenzidine) (NPB), TDATA, 2-TNATA, N,N'-bis(3-methyl phenyl)-N,N'-diphenyl-[1,1-biphenyl]-4,4'-diamine (TPD), or 4,4',4"-tris(N-carbazolyl)triphenylamine) (TCTA).

14. The organic light-emitting device of claim 1, wherein the compound of Formula 2 is represented by Formula 2A(1) or 2B(1):

<Formula 2A(1)>

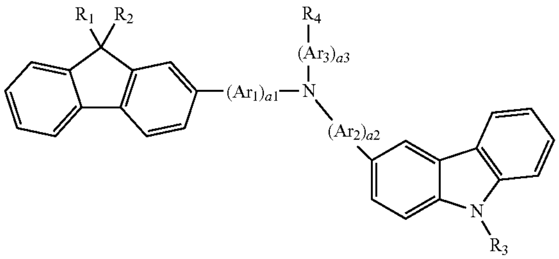

<Formula 2B(1)>

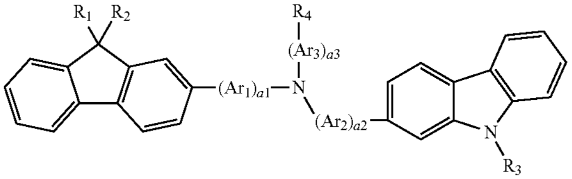

wherein, in Formulae 2A(1) and 2B(1), $R_1$ to $R_4$, $Ar_1$ to $Ar_3$, a1, a2, and a3 are the same as in claim 1.

15. The organic light-emitting device of claim 1, wherein the compound of Formula 2 is one of Compounds 309 to 320 and the compound of Formula 3 is one of Compounds 301 to 308:

301

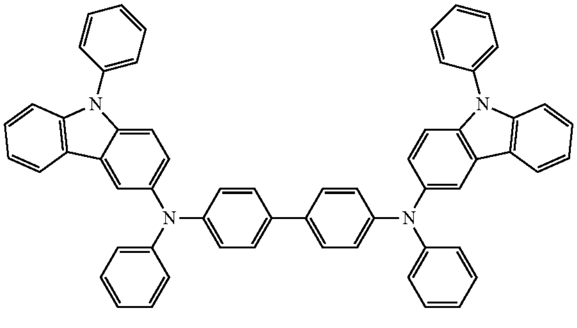

-continued
302
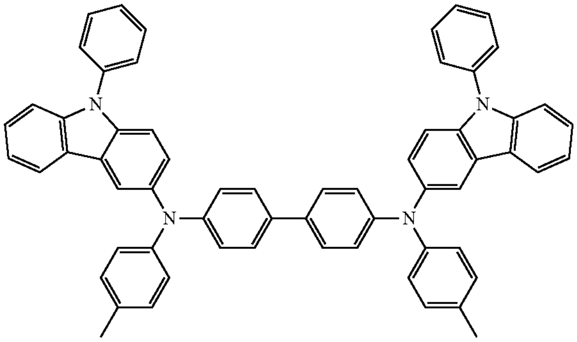
303
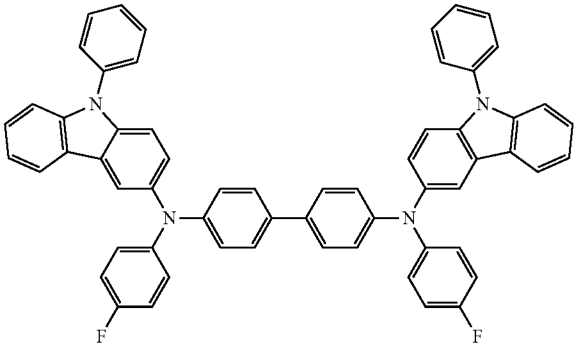
304
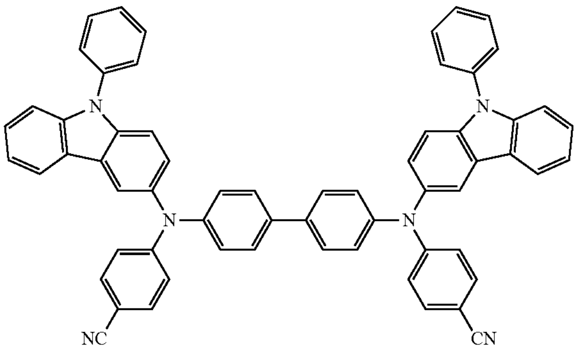
305
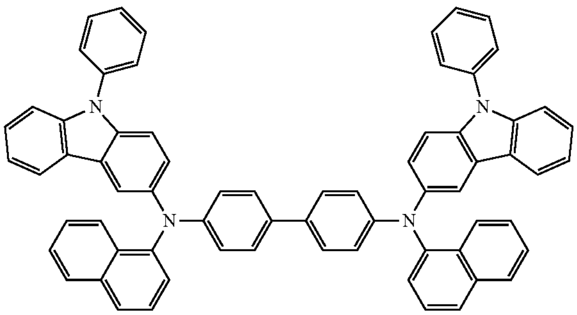
-continued
306
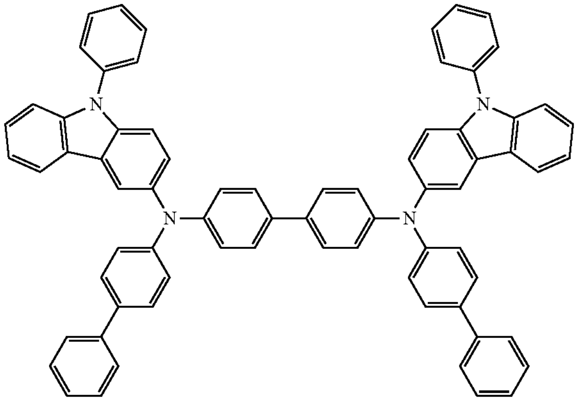
307
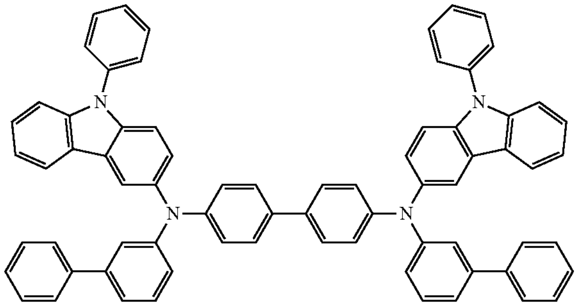
308
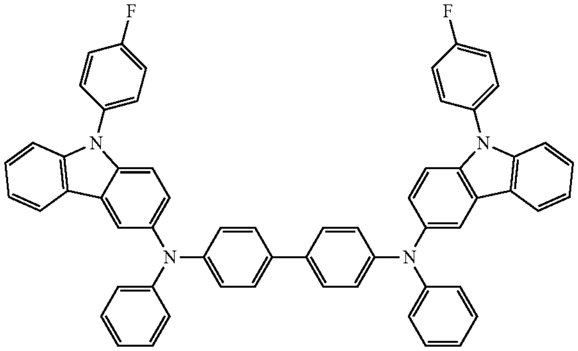
309
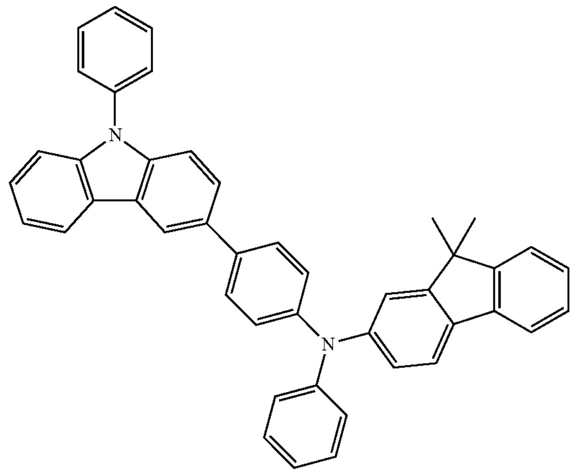

-continued
310
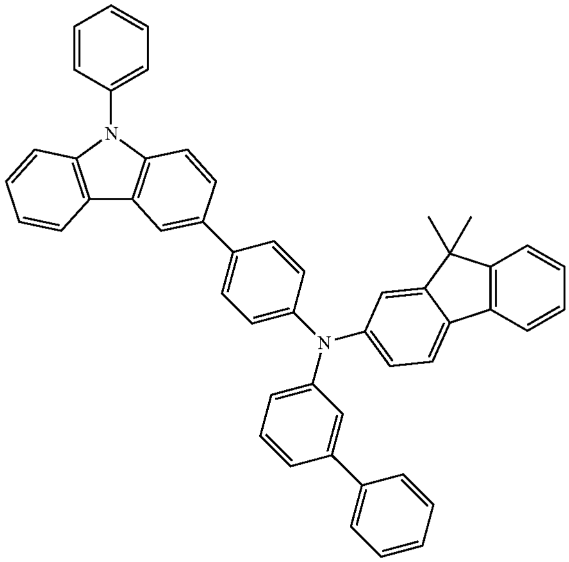
311
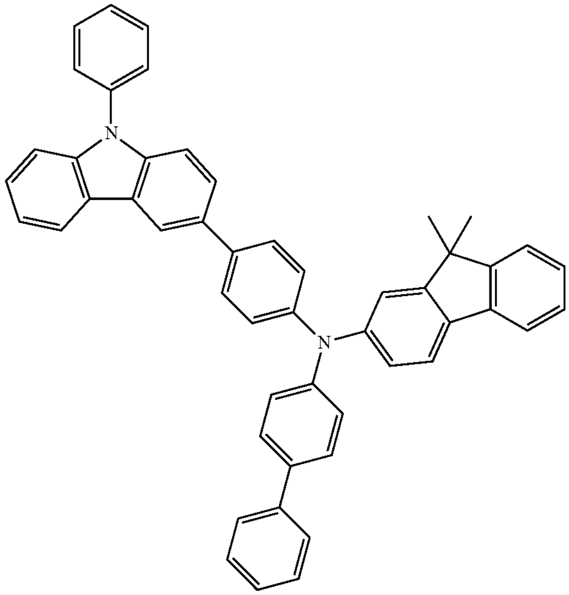
-continued
312
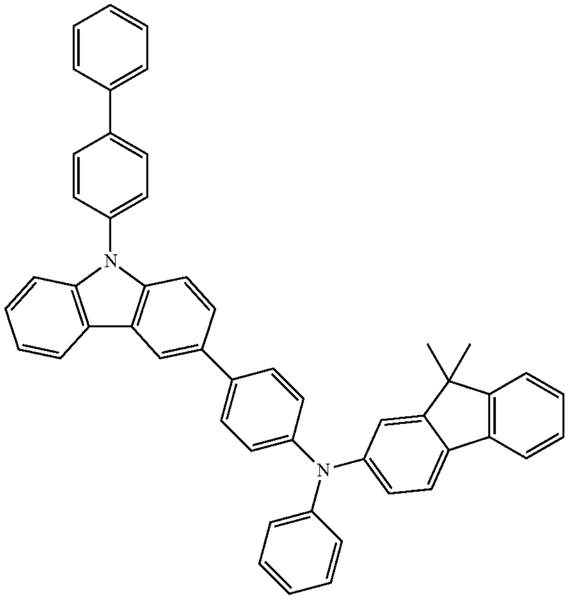
313
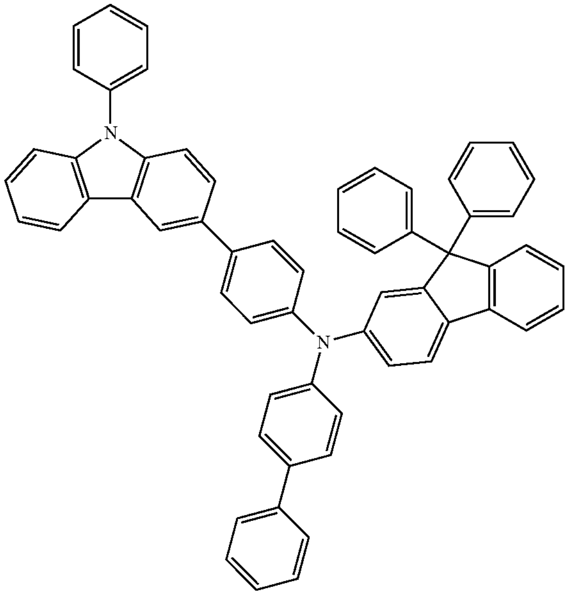

-continued
314
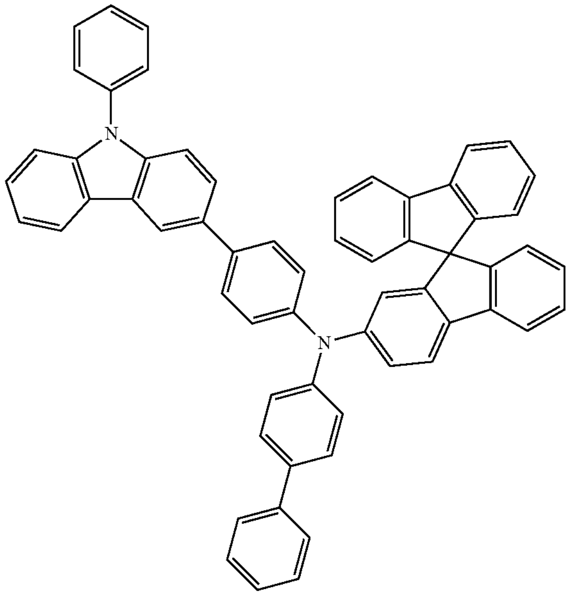
315
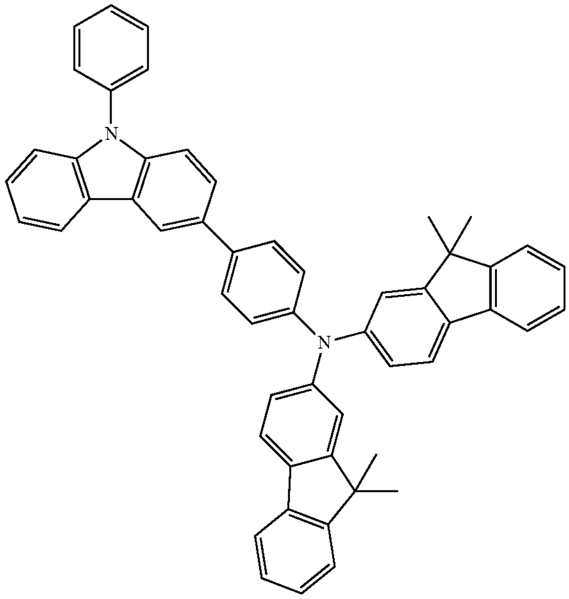
-continued
316
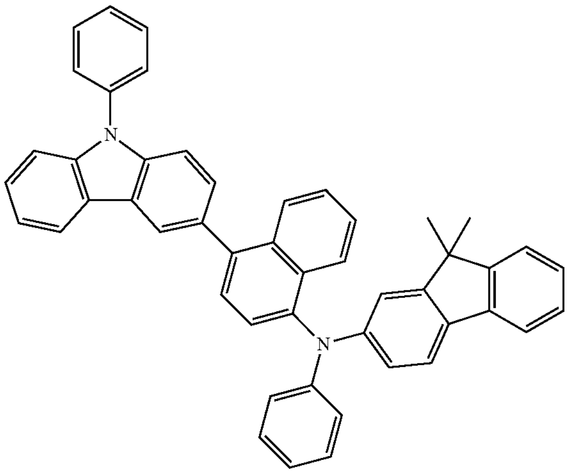
317
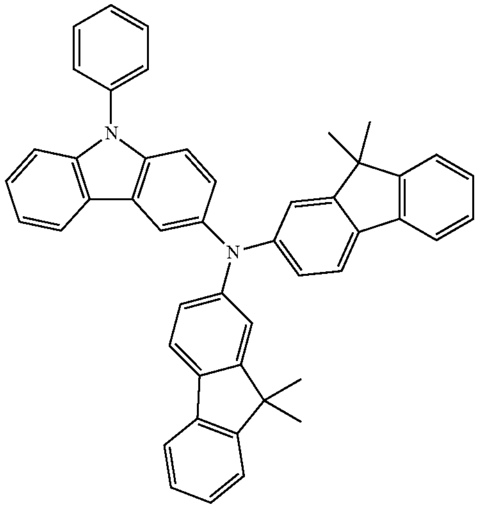
318
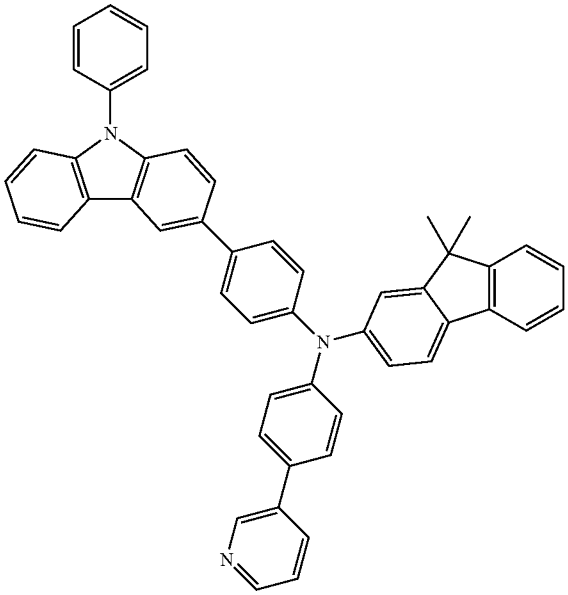

-continued

319

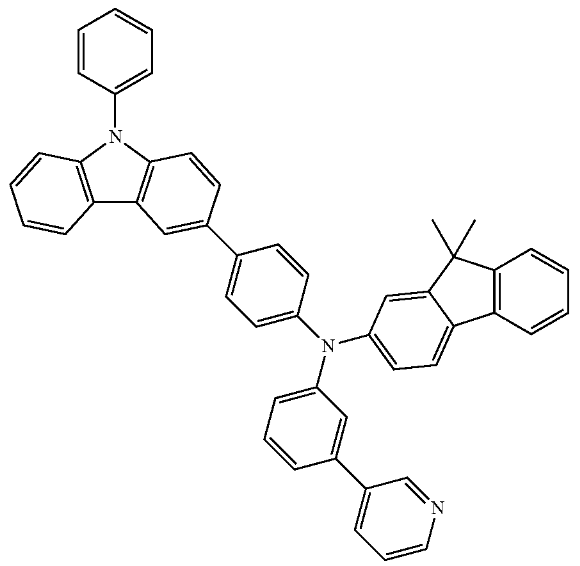

320

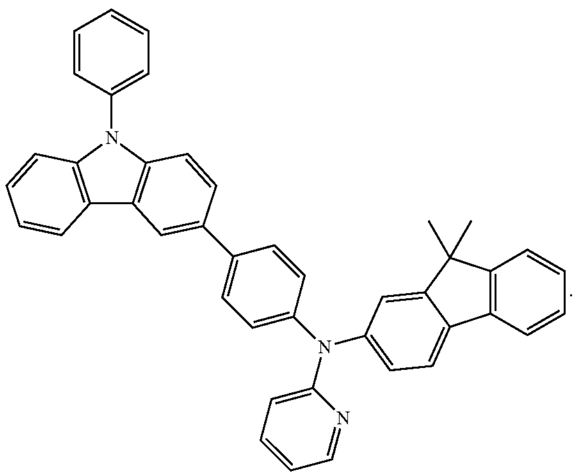

16. The organic light-emitting device of claim 1, wherein the hole-transporting region comprises a hole-transporting layer and a hole injecting-layer disposed between the hole-transporting layer and the first electrode.

17. The organic light-emitting device of claim 1, wherein in Formula 4, $Ar_{111}$ and $Ar_{112}$ are each independently selected from a phenylene group, a naphthylene group, a phenanthrenylene group, or a pyrenylene group; or a phenylene group, a naphthylene group, a phenanthrenylene group, a fluorenyl group, and a pyrenylene group, each substituted with at least one of a phenyl group, a naphthyl group, or an anthracenyl group;

$Ar_{113}$ to $Ar_{116}$ are each independently selected from, a $C_1$-$C_{10}$ alkyl group substituted with at least one of a phenyl group, a naphthyl group, or an anthracenyl group;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, and a fluorenyl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, fluorenyl group; or

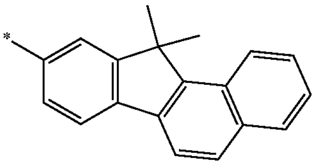, wherein * represents a connection to $Ar_{112}$, $Ar_{111}$, or $A_1$.

18. The organic light-emitting device of claim 1, wherein the blue emission layer further comprises a dopant and the dopant comprises a compound represented by Formula 500 below:

$Ar_{200}$—$[N(Ar_{201})(Ar_{202})]_{x1}$ <Formula 500> wherein, in Formula 500, $Ar_{200}$ is selected from, anthracene, pyrene, chrysene, phenanthrene, or benzofluorene; or anthracene, pyrene, chrysene, phenanthrene, or benzofluorene, each substituted with at least one of, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof or a phosphoric acid or a salt thereof;

a $C_6$-$C_{20}$ aryl group or a $C_2$-$C_{20}$ heteroaryl group; and a $C_6$-$C_{20}$ aryl group or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group;

$Ar_{201}$ and $Ar_{202}$ are each independently represented by one of Formulae 12-1 to 12-22; and
$x_1$ is 1 or 2:
Formula 12-1
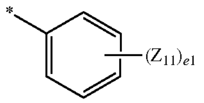
Formula 12-2
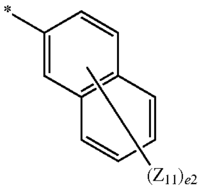
Formula 12-3
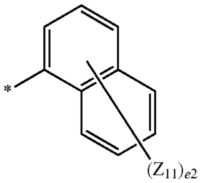
Formula 12-4
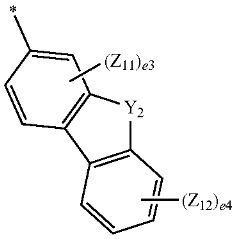
Formula 12-5
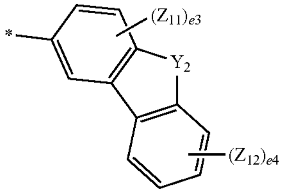
Formula 12-6
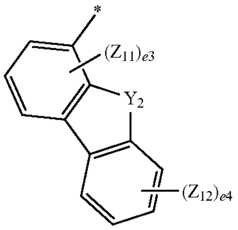
Formula 12-7
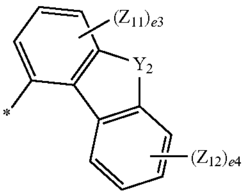
-continued
Formula 12-8
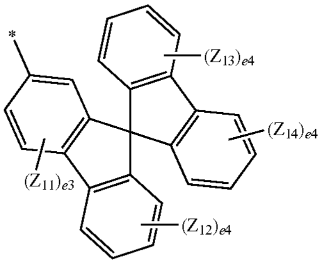
Formula 12-9
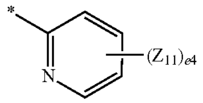
Formula 12-10
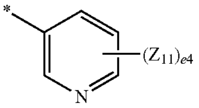
Formula 12-11
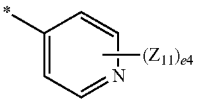
Formula 12-12
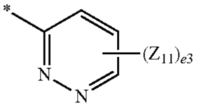
Formula 12-13
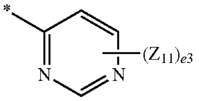
Formula 12-14
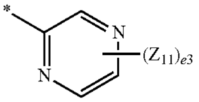
Formula 12-15
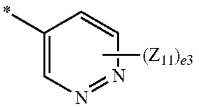
Formula 12-16
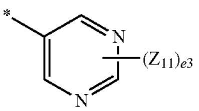
Formula 12-17
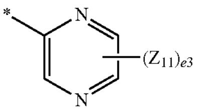
Formula 12-18
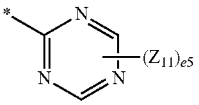

-continued

Formula 12-19

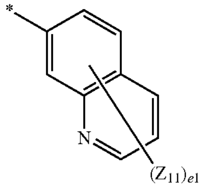

Formula 12-20

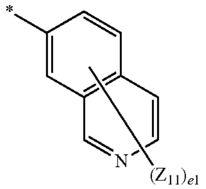

Formula 12-21

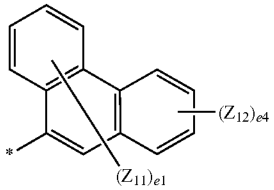

Formula 12-22

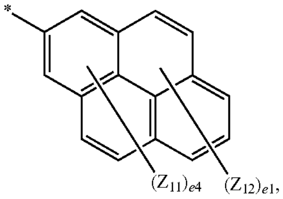

wherein, in Formulae 12-1 to 12-22, $Y_2$ is O, S, $C(R_{25})(R_{26})$ or $N(R_{27})$;

$Z_{11}$ to $Z_{14}$, and $R_{25}$ to $R_{27}$ are each independently selected from, a hydrogen, a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, or a phosphoric acid or a salt thereof;

a $C_6$-$C_{20}$ aryl group or a $C_2$-$C_{20}$ heteroaryl group;

a $C_6$-$C_{20}$ aryl group or a $C_2$-$C_{20}$ heteroaryl group, each substituted with at least one of a deuterium, a halogen atom, a hydroxyl group, a cyano group, a nitro group, an amino group, an amidino group, a hydrazine, a hydrazone, a carboxylic acid group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyl fluorenyl group, a diphenyl fluorenyl group, a carbazolyl group, a phenyl carbazolyl group, a pyridinyl group, a pyrimidinyl group, a pyrazinyl group, a pyridazinyl group, a triazinyl group, a quinolinyl group, or an isoquinolinyl group; or —$N(Q_{11})(Q_{12})$ or —$Si(Q_{13})(Q_{14})(Q_{15})$ (wherein, $Q_{11}$ to $Q_{15}$ are each independently selected from a $C_1$-$C_{20}$ alkyl group, a $C_1$-$C_{20}$ alkoxy group, a $C_6$-$C_{20}$ aryl group, or a $C_2$-$C_{20}$ heteroaryl group);

wherein e1 is an integer of 1 to 5;

e2 is an integer of 1 to 7;

e3 is an integer of 1 to 3;

e4 is an integer of 1 to 4; or e5 is 1 or 2; and

* represents a connection to N.

* * * * *